United States Patent
Kim

(10) Patent No.: US 12,402,370 B2
(45) Date of Patent: Aug. 26, 2025

(54) SEMICONDUCTOR DEVICE AND MANUFACTURING METHOD OF SEMICONDUCTOR DEVICE

(71) Applicant: MagnaChip Semiconductor, Ltd., Cheongju-si (KR)

(72) Inventor: Guk Hwan Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 17/940,461

(22) Filed: Sep. 8, 2022

(65) Prior Publication Data

US 2023/0006039 A1     Jan. 5, 2023

Related U.S. Application Data

(60) Continuation of application No. 17/844,344, filed on Jun. 20, 2022, now Pat. No. 11,996,444, which is a division of application No. 16/928,307, filed on Jul. 14, 2020, now Pat. No. 11,430,863.

(30) Foreign Application Priority Data

Apr. 2, 2020  (KR) .................. 10-2020-0040312

(51) Int. Cl.
    H10D 64/01    (2025.01)
    H10D 62/10    (2025.01)
    H10D 64/23    (2025.01)
    H10D 64/27    (2025.01)
    H10D 89/60    (2025.01)

(52) U.S. Cl.
    CPC ......... *H10D 62/112* (2025.01); *H10D 64/01* (2025.01); *H10D 64/258* (2025.01); *H10D 64/514* (2025.01); *H10D 89/601* (2025.01)

(58) Field of Classification Search
    None
    See application file for complete search history.

(56) References Cited

U.S. PATENT DOCUMENTS

| | | |
|---|---|---|
| 8,338,281 B2 | 12/2012 | Choi et al. |
| 9,871,063 B1 | 1/2018 | Oh et al. |
| 10,566,422 B2 | 2/2020 | Lee et al. |

(Continued)

FOREIGN PATENT DOCUMENTS

| | | |
|---|---|---|
| DE | 10 2008 063 324 A1 | 7/2009 |
| JP | 9-82949 A | 3/1997 |

(Continued)

OTHER PUBLICATIONS

German Office Action issued on Jun. 12, 2023, in corresponding German Patent Application No. 102020124781.8 (12 pages in English, 12 pages in German).

(Continued)

*Primary Examiner* — Bilkis Jahan
(74) *Attorney, Agent, or Firm* — NSIP Law

(57) ABSTRACT

A semiconductor device includes a source region, a drain region, and a gate insulating film formed on a substrate, a gate electrode formed on the gate insulating film, a first insulating film pattern formed to extend from the source region to a part of a top surface of the gate electrode, and a spacer formed on a side surface of the gate electrode in a direction of the drain region.

12 Claims, 17 Drawing Sheets

(56) References Cited

U.S. PATENT DOCUMENTS

| | | | |
|---|---|---|---|
| 10,727,300 B2 | 7/2020 | Kim et al. | |
| 2008/0179639 A1* | 7/2008 | Gambino | H01L 27/14603 438/57 |
| 2009/0166765 A1 | 7/2009 | Lee | |
| 2011/0042756 A1 | 2/2011 | Hikida | |
| 2012/0228704 A1* | 9/2012 | Ju | H01L 29/66689 257/E29.256 |
| 2013/0020632 A1* | 1/2013 | Disney | H01L 29/0847 257/E21.409 |
| 2013/0134512 A1* | 5/2013 | Cheng | H01L 29/402 257/E29.256 |
| 2013/0299919 A1 | 11/2013 | Chen et al. | |
| 2015/0102405 A1 | 4/2015 | Ryu et al. | |
| 2016/0190269 A1* | 6/2016 | Brown | H10D 30/0221 438/286 |
| 2016/0204279 A1 | 7/2016 | Horch et al. | |
| 2017/0352731 A1* | 12/2017 | Kuo | H10D 30/0212 |
| 2018/0019262 A1 | 1/2018 | Oh et al. | |
| 2018/0097065 A1* | 4/2018 | Zhu | H10D 30/025 |
| 2018/0358349 A1 | 12/2018 | Hwang et al. | |
| 2019/0019866 A1* | 1/2019 | Kim | H10D 64/516 |
| 2019/0221666 A1* | 7/2019 | Bang | H10D 64/62 |
| 2019/0288066 A1* | 9/2019 | Lee | H10D 30/0221 |
| 2020/0251575 A1 | 8/2020 | Kim et al. | |
| 2020/0279925 A1 | 9/2020 | Fan et al. | |
| 2020/0357887 A1 | 11/2020 | Chabak et al. | |

FOREIGN PATENT DOCUMENTS

| | | |
|---|---|---|
| KR | 10-2009-0073487 A | 7/2009 |
| KR | 10-2010-0079175 A | 7/2010 |
| KR | 10-2018-0009009 A | 1/2018 |
| KR | 10-2019-0008463 A | 1/2019 |
| KR | 10-2019-0109685 A | 9/2019 |
| KR | 10-2020-0008170 A | 1/2020 |
| KR | 10-2020-0095640 A | 8/2020 |

OTHER PUBLICATIONS

Korean Office Action issued on Oct. 9, 2021 in counterpart Korean Patent Application No. 10-2020-0100930 (13 pages in Korean).
Korean Office Action Issued on Apr. 23, 2021 in counterpart Korean Patent Application No. 10-2020-0040312 (8 pages in Korean).
Korean Office Action issued on Aug. 12, 2021 in counterpart Korean Patent Application No. 10-2020-0040312 (7 pages in Korean).

* cited by examiner

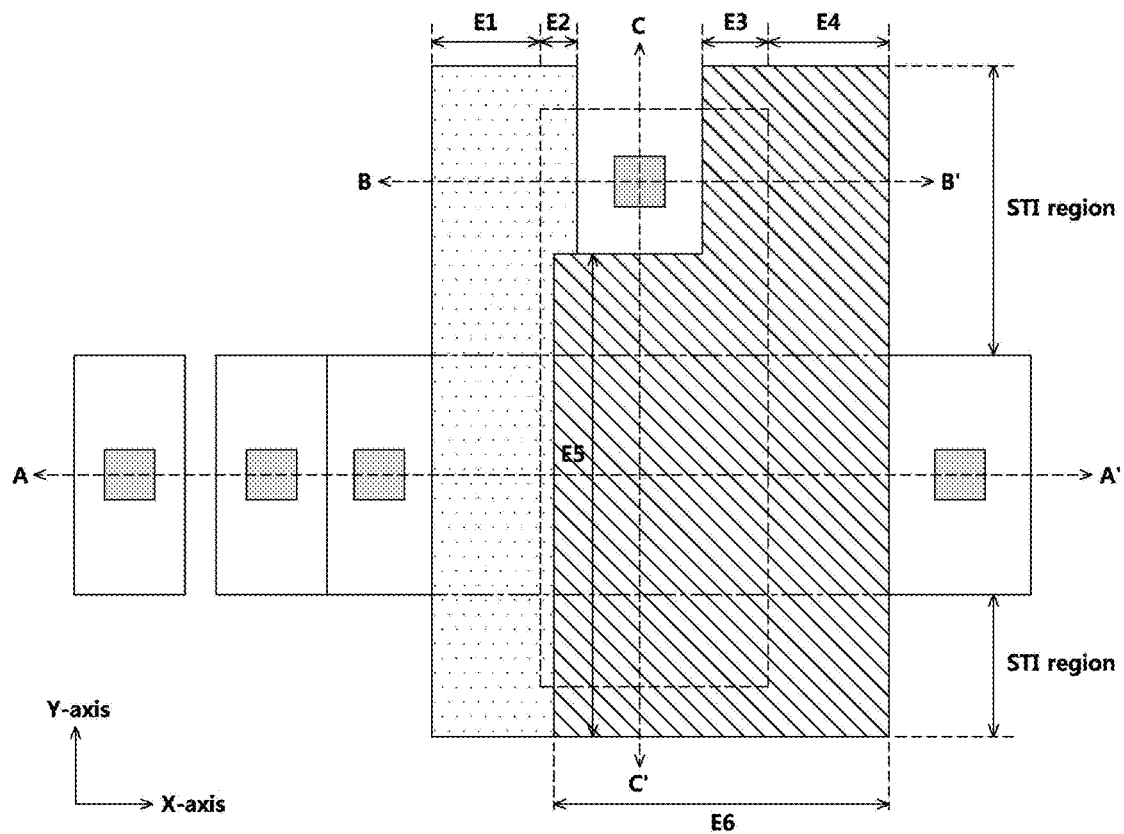

SEMICONDUCTOR DEVICE AND MANUFACTURING METHOD OF SEMICONDUCTOR DEVICE

CROSS-REFERENCE TO RELATED APPLICATIONS

This application is a continuation of U.S. patent application Ser. No. 17/844,344, filed on Jun. 20, 2022, which is a divisional application of U.S. patent application Ser. No. 16/928,307, filed on Jul. 14, 2020, which claims the benefit under 35 U.S.C. 119(a) of Korean Patent Application No. 10-2020-0040312 filed on Apr. 2, 2020 in the Korean Intellectual Property Office, the entire disclosure of which is incorporated herein by reference for all purposes.

BACKGROUND

1. Field

The following description relates to a semiconductor device. The following description also relates to a method of manufacturing such a semiconductor device.

2. Description of Related Art

In general, an ESD circuit may be formed to protect a semiconductor device formed inside a core circuit from an electrostatic discharge (ESD) or an electrical over stress (EOS). In addition, a gate insulating film may be formed to be thick in order to be prepared for an example in which an ESD or an EOS enters through the gate electrode of the semiconductor device. Such an approach may be used because a thin gate insulating film may be destroyed when an ESD or an EOS is applied to the semiconductor device. In addition, in order to withstand the ESD or the EOS, a structure in which the resistance of the gate electrode is increased may often be used. Therefore, in order to increase the resistance of the gate electrode, a silicide blocking insulating film may be formed on the surface of the gate electrode. In this manner, a high ESD or a high EOS applied to the gate electrode may be mitigated to some extent.

However, when a high electric field, such as an ESD or an EOS, is formed, there may take place a phenomenon in which leakage current occurs between the gate electrode and the drain electrode, or leakage current may occur between the gate electrode and source electrode. In order to prevent this phenomenon, the distance between the gate electrode and the drain electrode may be increased. Thus, despite a high electric field due to the ESD or the EOS, a leakage current between the gate electrode and the drain electrode may nonetheless be blocked. However, the source region and the gate electrode may be disposed to be as close as possible, in order to form a channel between the gate electrode and the source electrode. Due to using this structure, when a high electric field is applied to the gate electrode, a leakage current may occur between the gate electrode and the source electrode region.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a source region, a drain region, and a gate insulating film formed on a substrate, a gate electrode formed on the gate insulating film, a first insulating film pattern formed to extend from the source region to a part of a top surface of the gate electrode, and a spacer formed on a side surface of the gate electrode in a direction of the drain region.

The semiconductor device may further include a second insulating film pattern formed to extend onto the gate electrode, the spacer, and the drain region.

The first insulating film pattern and the second insulating film pattern may be in contact with each other.

The second insulating film pattern may be thicker than the first insulating film pattern.

The first insulating film pattern and the second insulating film pattern may be formed to be spaced apart from each other.

The semiconductor device may further include a source silicide layer formed on the source region, a source contact plug formed on the source silicide layer, a drain silicide layer formed on the drain region, a drain contact plug formed on the drain silicide layer, a gate silicide layer formed on the gate electrode, and a gate contact plug formed on the gate silicide layer.

The first insulating film pattern may partially overlap the source region and may contact the source silicide layer, and may be disposed to be spaced apart by a predetermined distance from the source contact plug.

The second insulating film pattern may partially overlap the drain region, may contact the drain silicide layer, and may be disposed to be spaced apart by a predetermined distance from the drain contact plug.

The first and second insulating film patterns may be formed to be spaced apart by a predetermined distance from the gate contact plug.

The gate contact plug may be completely surrounded by the first insulating film pattern and the second insulating film pattern, when viewed from a top view of the semiconductor device.

The semiconductor device may further include a first conductivity type well region formed on the substrate, a second conductivity type extended drain junction region formed to surround the drain region, a first conductivity type body region surrounding the source region, a first conductivity type body pickup region formed in the first conductivity type body region, a second conductivity type deep well region including the first conductivity type well region, and a second conductivity type deep well pickup region formed in the second conductivity type deep well region.

The second insulating film pattern may be formed to directly contact the second conductivity type extended drain junction region, the drain region, and the drain silicide layer.

The first insulating film pattern may be formed to directly contact the first conductivity type body region, the source region, and the source silicide layer.

The second insulating film pattern may have a third region formed on the substrate and a fourth region formed on the gate electrode, and a length of the third region may be shorter than a length of the fourth region.

The top surface of the gate electrode may be formed to be in direct contact with the first insulating film pattern and the second insulating film pattern.

The gate insulating film may include a first gate insulating film and a second gate insulating film having different thicknesses from each other.

The first insulating film pattern may have a first region formed on the substrate and a second region formed on the gate electrode, and a length of the first region may be longer than a length of the second region.

In another general aspect, a manufacturing method of a semiconductor device includes forming a gate insulating film and a gate electrode on a substrate, forming a first insulating film on an entire region of the substrate, forming a first mask pattern on the first insulating film, forming a first insulating film pattern on one end of the gate electrode using the first mask pattern, and forming a spacer on an other end of the gate electrode, removing the first mask pattern, forming a source region adjacent to the one end of the gate electrode, and forming a drain region adjacent to the other end of the gate electrode.

The method may further include depositing a second insulating film on an entire surface of the substrate, forming a second mask pattern on the second insulating film, removing the second insulating film formed on the one end of the gate electrode by using the second mask pattern, and forming a second insulating film pattern on the other end of the gate electrode and the spacer; and removing the second mask pattern.

The method may further include forming a drain silicide layer on the drain region, forming a source silicide layer on the source region, forming a gate silicide layer on the gate electrode, and forming a drain contact plug, a source contact plug, and a gate contact plug on the drain silicide layer, the source silicide layer, and the gate silicide layer, respectively.

The method may further include forming a deep well region and a device isolation region on the substrate, forming a first conductivity type well region in the deep well region, forming a first conductivity type body region and a second conductivity type extended drain region on the first conductivity type well region, and forming a deep well pickup region and a body pickup region in the deep well region and the first conductivity type body region, respectively.

The first insulating film pattern and the second insulating film pattern may be in contact with each other.

The first insulating film pattern and the second insulating film pattern may be formed to be spaced apart from each other.

The second insulating film pattern may be formed so as to overlap with the first insulating film pattern, and the second insulating film pattern may be formed on the first insulating film pattern.

A thickness of the first insulating film pattern may be thinner than a thickness of the second insulating film pattern.

The first insulating film pattern may partially overlap the source region and may contact the source silicide layer, and may be disposed spaced apart from the source contact plug by a predetermined distance.

The second insulating film pattern may partially overlap the drain region, may contact the drain silicide layer, and may be disposed spaced apart from the drain contact plug by a predetermined distance.

The first and second insulating film patterns may be formed spaced apart by a predetermined distance from the gate contact plug.

The first insulating film pattern may be formed to directly contact the first conductivity type body region, the source region, and the source silicide layer.

The second insulating film pattern may be formed to be in direct contact with the second conductivity type extended drain junction region, the drain region, and the drain silicide layer.

The method may further include forming a borderless contact insulating film and an interlayer insulating film on the drain silicide layer and the source silicide layer, forming the drain contact plug and the source contact plug, after the forming the borderless contact insulating film and an interlayer insulating film on the drain silicide layer and the source silicide layer.

The gate contact plug may be completely surrounded by the first insulating film pattern and the second insulating film pattern, when viewed from a top view of the semiconductor device.

A top surface of the gate electrode may be formed to be in direct contact with the first insulating film pattern and the second insulating film pattern.

In another general aspect, a semiconductor device includes a source region, a drain region, and a gate insulating film formed on a substrate, a gate electrode formed on the gate insulating film, a first insulating film pattern formed to extend from the source region to a part of the top surface of the gate electrode, and a second insulating film pattern formed to extend onto the gate electrode and the drain region.

The semiconductor device may further include a spacer formed on a side surface of the gate electrode in the direction of the drain region.

The second insulating film pattern may extend onto the spacer.

The first insulating film pattern and the second insulating film pattern may be in contact with each other.

The second insulating film pattern may be thicker than the first insulating film pattern.

The first insulating film pattern and the second insulating film pattern may be formed to be spaced apart from each other.

Other features and aspects will be apparent from the following detailed description, the drawings, and the claims.

BRIEF DESCRIPTION OF THE DRAWINGS

FIGS. 1A and 1B are plan views of a semiconductor device, according to one or more examples.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
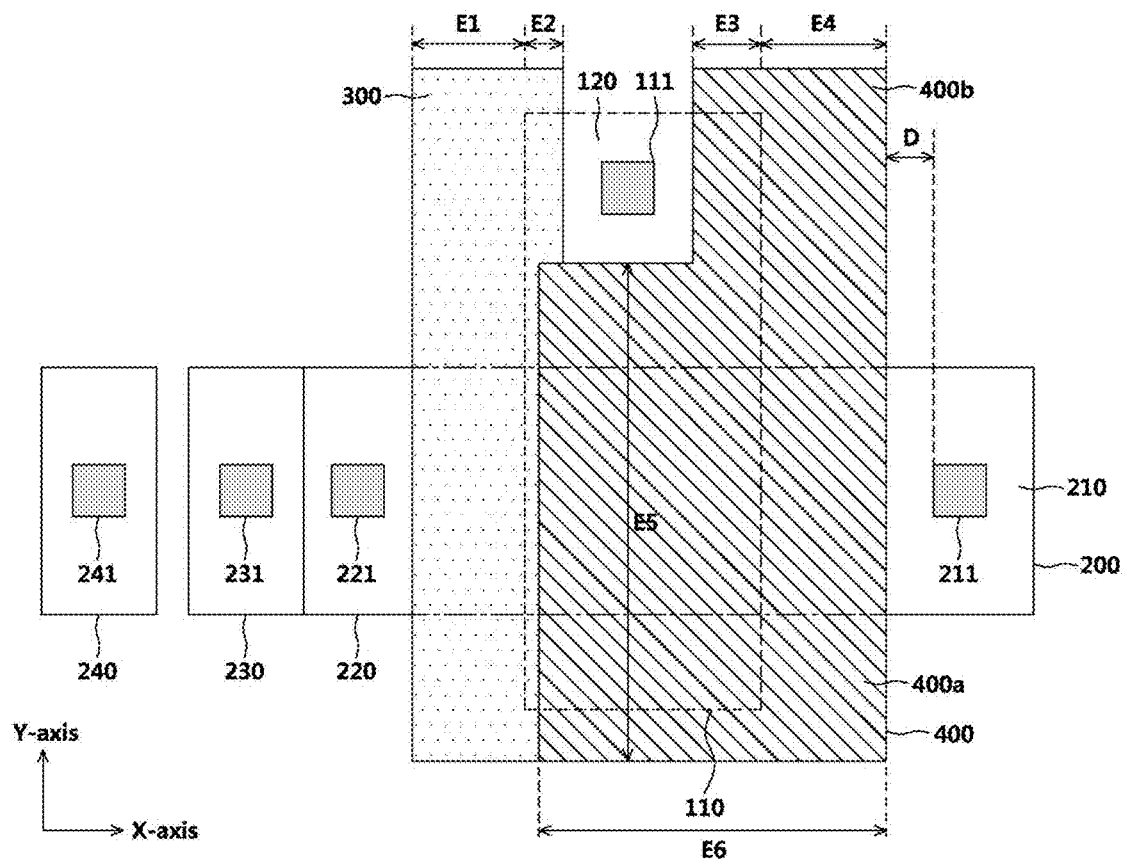

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Terms such as "including" or "comprising" used in the embodiments should not be construed as necessarily including all of various components, or various operations described in the specification, and it should be construed that some of the components or some of the operations may not be included or may further include additional components or operations.

The use of the term "may" herein with respect to an example or embodiment (e.g., as to what an example or embodiment may include or implement) means that at least one example or embodiment exists where such a feature is included or implemented, while all examples are not limited thereto.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The following description also provides a semiconductor device that may be capable of reducing leakage current, by increasing resistance between a gate electrode and a source region, and a manufacturing method of such a semiconductor device.

FIG. 1A is a plan view of a semiconductor device, according to one or more examples, and FIG. 1B illustrates lines A-A', B-B', and C-C' in the plan view of FIG. 1A. Descriptions of the cross-sectional view of the line A-A', the cross-sectional view of the line B-B', and the cross-sectional view of the line C-C' of the semiconductor device are described in greater detail below.

Referring to the one or more examples illustrated in FIG. 1A, an active region 200 including a drain region 210, a source region 220, a body pickup region 230, and a deep well pickup region 240 may be formed on a substrate. Each of the regions 210, 220, 230, and 240 of the active region 200 may be formed by using an active mask pattern, as a non-limiting example. The body contact region 230 and the deep well pickup region 240 may be spaced apart at a predetermined distance. A drain contact plug 211, a source contact plug 221, and a body contact plug 231 and a DNW contact plug 241 may be formed in the drain region 210, the source region 220, the body pickup region 230 and the deep well pickup region 240 of the active region 200, respectively. The above-described contact plugs 211, 221, 231, and 241 may be formed by including one or more of the contact plugs 211, 221, 231, and 241 in a corresponding region. Although described in greater detail below, contact plugs, shown in FIG. 2A as 212, 222, 232, 242 that are connected to metal wires may be formed on the contact plugs 211, 221, 231, and 241, respectively.

Also, the gate region 110, also referred to as a gate electrode 110, may be formed between the source region 220 and the drain region 210. That is, the source region 220 and the drain region 210 may be present on both sides of the gate electrode 110, and the gate contact plug 111 may be formed on the gate electrode 110.

As illustrated in FIG. 1A the semiconductor device may include a first insulating film pattern 300 and a second insulating film pattern 400. Because the first insulating film pattern 300 may be formed by etching an LDD insulating film, it may also be referred to as an LDD insulating film pattern. In addition, the second insulating film pattern 400 may be formed by using a silicon oxide film or a silicon nitride film material so that a salicide or a silicide is not formed. Because the second insulating film pattern 400 is formed using such a non-sal process, it may be referred to as a non-sal dielectric pattern. The first insulating film pattern 300 and the second insulating film pattern 400 may be formed by using respective mask patterns, for example, as shown in FIGS. 9D and 9H. Each mask pattern may be designed using different layouts corresponding to the shapes of the first insulating film pattern 300 and the second insulating film pattern 400. The first insulating film pattern 300 and the second insulating film pattern 400 may also be formed in various forms, which is illustrated in greater detail in other examples, to be described further later.

In the present one or more examples, the shape, size, and area of the first insulating film pattern 300 may be determined by using a lightly doped region or lightly doped drain (LDD) forming process.

Referring to FIG. 1A, the first insulating film pattern 300 may be formed over a part of the source region 220 and the gate electrode 110. That is, the first insulating film pattern 300 may be formed to extend to a top surface of the gate electrode 110. Also, a part of the first insulating film pattern 300 may overlap the second insulating film pattern 400. The first insulating film pattern 300 may extend to the top surface of the gate electrode, so as to have lengths E1 and E2. The gate silicide layer 120 may be formed on the gate electrode 110, where no first and second insulating film pattern 300 and 400 are formed. In such an example, the first insulating film pattern 300 may be divided into a first region having a length E1, and a second region having a length E2. The length of E1 may be formed longer than E2. The longer the length of E1, the less the leakage current between the gate electrode 110 and the source region 220. This result may occur because a resistance is increased between the gate electrode and the source region by the presence of the first insulating film pattern 300.

Referring to FIG. 1A, the second insulating film pattern 400 may be a region in which the silicide layer 120 is not formed by the second mask pattern, for example, see FIG. 9H. The second insulating film pattern 400 may be disposed entirely or partially on the top surfaces of the gate electrode 110 and the drain region 210. Also, the second insulating film pattern 400 may overlap a part of the edge of the first insulating film pattern 300. The second insulating film pattern 400 may be formed to extend onto a part of the gate electrode 110 and the drain region 210. As such, the region 400 in which the silicide layer is not formed on the gate electrode 110 may be larger than the region 120 in which the silicide layer is formed. The resistance of the gate electrode 110 may be increased by the presence of the first insulating film pattern 300 and the second insulating film pattern 400. Accordingly, it may be possible to prevent failure of a semiconductor device caused by an ESD or an EOS, due to such greater resistance.

The second insulating film pattern 400 may include a main region 400a and an extended region 400b. The main region 400a may be disposed to include a part of the top surface of the gate electrode 110 and to include a part of the drain region 210 where the first insulating film pattern 300 may partially overlap. The extension region 400b may be formed to extend in the Y-axis direction so that the gate silicide layer 120 may remain at one end of the main region 400a. As illustrated in FIG. 1A, the main region 400a may be larger in size than the extended region 400b.

In general, in order to form an Ohmic contact on the surface of the gate region, a silicide such as a cobalt silicide such as $CoSi_2$, or a nickel silicide such as NiSi, or a titanium silicide such as $TiSi_2$, may be formed. However, when a second insulating film pattern, such as a non-silicide region, is formed between the gate electrode 110 and the drain region 200 as illustrated in FIG. 1A, resistance may increase between the gate electrode and the drain region, which may thereby reduce leakage current.

FIG. 1B illustrates a cross-section of a semiconductor device that is described in greater detail below. Each of the cross-sectional views, A-A', B-B', and C-C', is described in greater detail with reference to examples below. Referring to FIG. 1B, a device isolation region, for example, a shallow trench isolation (STI) region, may be formed around the active region 200.

Figure 2A:
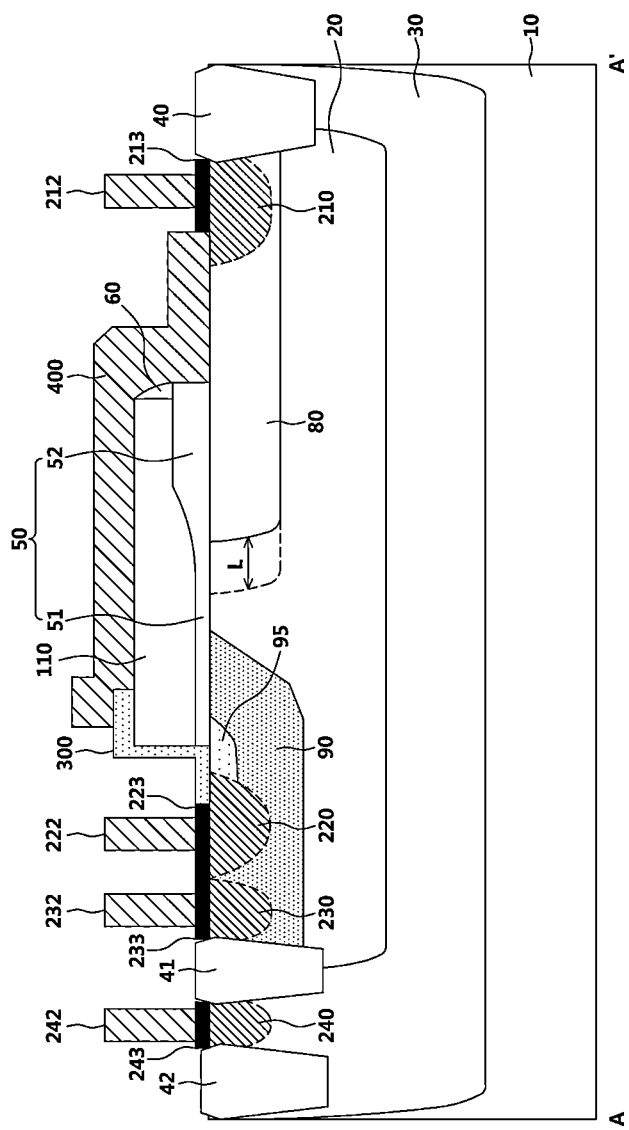
FIGS. 2A, 2B, and 2C are cross-sectional views of a semiconductor device with respect to the line A-A' of FIG. 1.

FIG. 2A is a cross-sectional view of a semiconductor device with respect to the line A-A' of FIG. 1B, according to one or more examples. Referring to the drawings, the semiconductor device may include a well region 20 of a first conductivity type, that is, as a non-limiting example, a P type, formed at a predetermined depth on the top surface of the substrate 10. The well region 20 may be disposed between the device isolation regions 40 and 41 and may be formed to be deeper than the device isolation regions 40 and 41.

The gate insulating film 50 including the first gate insulating film 51 and the second gate insulating film 52, which may have different thicknesses, are formed on the well region 20. The gate electrode 110 may be disposed on the gate insulating film 50. The drain region 210 and the source region 220 may be formed in the well region 20 and may be disposed on both sides, underneath the gate insulating film 50.

The gate insulating film 50 may include a first gate insulating film 51 and a second gate insulating film 52, each having different thicknesses. For example, the first gate insulating film 51 may be thinner than the second gate insulating film 52, and the second gate insulating film 52 may be formed to be thicker than the first gate insulating film 51. The second gate insulating film 52 may be further divided into two parts. That is, the second gate insulating film 52 may have a part that becomes smaller in thickness as it approaches the first gate insulating film 51, and may have a part that has a constant thickness in a direction of the spacer 60. Such a part where the thickness becomes smaller as it approaches the first gate insulating film 51 may occur during the process of manufacturing the gate insulating film 50. By using the gate insulating films 51 and 52 to have different thicknesses, it may be possible to implement a level shift semiconductor device in which a voltage used in a medium voltage or high voltage device may be allowed.

The thinner first gate insulating film 51 may be disposed near the source region 220, and the thick second gate insulating film 52 may be disposed near the drain region 210. Such an approach may be used to prevent the gate insulating film 50 from being destroyed, because the drain voltage may be higher than the source voltage. For example, if the drain voltage is over 3.3V, which is a medium voltage, and the gate voltage is about 0.5V to 2V, which is a low voltage, there may be a problem that the drain current may become too low, and for this reason, the width of the channel region is to be widened, so that the region of the semiconductor device may be increased, if only a thick gate insulating film is used. Conversely, if only a thin gate insulating film is used, there may be an issue that the gate insulating film may be destroyed due to using a drain voltage higher than a medium voltage. Therefore, the above-described issue may be solved by using the gate insulating film 50 to have a structure that includes the thin gate insulating film 51 and the thick gate insulating film 52.

Because the drain voltage may be higher than the source voltage, the gate insulating film 50 may be formed to have an incline so that the thickness of the insulating film becomes thinner as it extends from the drain region to the source region. The drain region may be formed to be spaced apart by a predetermined distance from the gate electrode 110, which may increase the breakdown voltage.

The first insulating film pattern 300 and the spacer 60 may be formed on both sides of the gate electrode 110 and the gate insulating film 50, respectively. Typically, only spacers are formed on both sides of the gate electrode 110. However, in the present one or more examples, the first insulating film pattern 300 formed by using the first mask during the LDD process may be disposed near the source region 220 side, such that the source region 220 may overlap a part of the first insulating film pattern 300. In addition, a spacer 60 may be formed on the drain region 210 side. The spacer 60 may be formed in the region in which no first insulating film pattern 300 is formed. Such an approach is used because the first insulating film may be formed as a spacer-shaped insulating film on all sides of the gate electrode 110 if a blanket etch-back process is performed without the first mask pattern. Thus, the first insulating film pattern 300 and the spacer insulating film 60 may be formed of the same material.

The second insulating film pattern 400 may overlap a part of the first insulating film pattern 300 and may extend to the drain region 210, while covering the top surface of the gate electrode 110 and the spacer 60. The thickness of the second insulating film pattern 400 may be formed to be thicker than the first insulating film pattern 300. For example, the second insulating film pattern 400 may be designed to have a sufficient thickness for proper operation. Such a choice of thickness may be made because when the second insulating film pattern 400 is thin, the second insulating film pattern 400 may be removed when various etching processes are performed in a subsequent process. For example, in such a case, an unwanted silicide layer may be formed, and using approaches according to examples may avoid such an undesired result.

The semiconductor device may further include an extended drain junction region 80. The extended drain junction region 80 may extend from the drain region 210 to the second gate insulating film 52, in order to provide low drain resistance. As illustrated in FIG. 2A, the extended drain junction region 80 may have an additional length L that extends to the first gate insulating film 51, which may be a thin gate insulating film. That is, the additional length of the extended drain junction region 80 may be disposed by freely adjusting the length between the gate insulating films 51 and 52. Also, the extended drain junction region 80 may be formed to surround the drain region 210, because an ion implantation may be performed with higher energy than that used for the drain region 210. The extended drain junction region 80 may be formed by using N-type impurities, such as phosphorus or arsenic, as non-limiting examples. The depth of the extended drain junction region 80 may be formed to be thinner than the device isolation region 40 disposed next to the extended drain junction region 80.

Figure 2B:
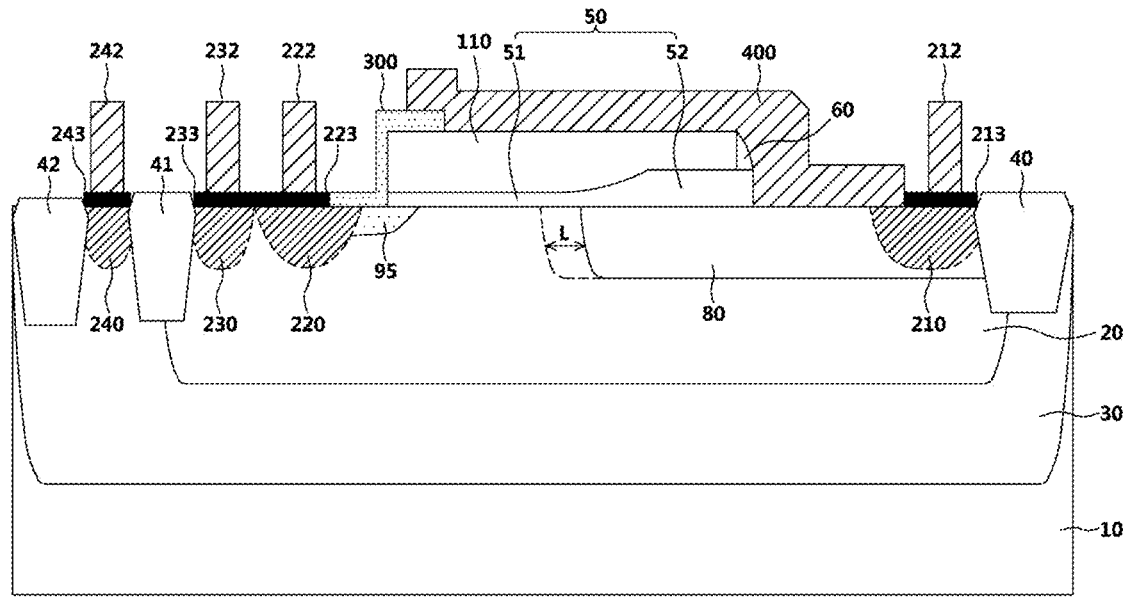

The semiconductor device may further include a P-body region 90 of the first conductivity type, which may be P-type. The body region 90 may be located under the first gate insulating film 51, which may be a thin gate insulating film, and may serve as a channel region. The body region 90 may surround the source region 220 and the body contact region 230. The depth of the body region 90 may be thinner than the device isolation region 41 disposed next to the body region 90 and deeper than the extended drain junction region 80. The body region 90 may be disposed to be spaced apart from the extended drain junction region 80 by a predetermined distance. In the absence of the body region 90, the well region 20 of the first conductivity type may perform the channel region instead. Therefore, the body region 90 may be considered as an optional region. This choice may be made possible because the conductivity types of the body region and the well region are the same, that is, for example, both P-type, as a non-limiting example. An example in which the body region 90 is not formed is illustrated in FIG. 2B, below.

The semiconductor device may further include a deep well region (DNW) 30 of the second conductivity type, which may be N-type. The deep well region 30 of the second conductivity type may be required when a semiconductor device and other devices are to be isolated. The deep well region 30 may be disposed between the device isolation regions 40 and 42, and may include a well region 20 of a first conductivity type. A second conductivity type deep well pickup region 240 used for applying a bias voltage to the second conductivity type deep well region 30 may be further formed, in a non-limiting example.

The semiconductor device may include isolation regions 40 and 41 formed next to the drain region 210 and the body pickup region 230 to isolate the semiconductor device from adjacent devices. The device isolation regions 40 and 41 may be formed using one of Shallow trench isolation (STI), Medium Trench Isolation (MTI), and Deep Trench Isolation (DTI) approaches. The device isolation regions 40 and 41 may use a LOCOS oxide film instead of a trench. In addition, the trench region may be formed by filling with a silicon oxide film ($SiO_2$), a silicon nitride film (SiN), or a polysilicon material, or the trench region may be formed by combining any two or more of the above-mentioned materials.

The semiconductor device may include a body pickup region or body contact region 230 of a first conductivity type, located between the device isolation region 41 and the source region 220. The body pickup region 230 of the first conductivity type may be used for applying a ground voltage to the well region 20 of the first conductivity type or the body region 90 of the first conductivity type.

As illustrated in FIG. 2A, the silicide layers 243, 233, 223, and 213 may be disposed on a second conductivity type deep well contact region 240, a body pickup region 230, a part of a source region 220, and a part of top surface of drain region 210, according to a non-limiting example. A source contact plug 222 and a drain contact plug 212 may be respectively formed on the source silicide layer 223 and the drain silicide layer 213. In addition, a body contact plug 232 and a deep well contact plug 242 may be formed on the body contact silicide layer 233 and the deep well contact silicide layer 243, respectively. In such an example, the silicide layers 243, 233, 223, and 213 may refer to regions in which materials such as a cobalt silicide such as $CoSi_2$, a nickel silicide such as NiSi, a titanium silicide such as $TiSi_2$, and the like, are formed. Thus, the material of the silicide layers 243, 233, 223, 213 is made of a metal-silicide material, non-limiting examples of which are enumerated, above.

In addition, the first insulating film pattern 300 of the semiconductor device according to one or more examples may partially overlap with the source region 220 and may be in contact with the source silicide layer 223, and may be disposed to be spaced apart from the source contact plug 222 by a predetermined distance. The first insulating film pattern 300 may have a first region E1 formed on the substrate and may have a second region E2 formed on the gate electrode. The length of the first region E1 may be formed to be longer than the length of the second region E2, as shown in FIG. 1A. The first insulating film pattern 300 may be formed to directly contact the first conductivity type body region 90, the source region 220, and the source silicide layer 223.

The second insulating film pattern 400 may be thicker than the first insulating film pattern 300, may be formed to be in contact with the first insulating film pattern 300, and may be formed to extend onto the gate electrode 110, the spacer 60, and the drain region 210. Therefore, the second insulating film pattern 400 may partially overlap the drain region 210 and may be in contact with the drain silicide layer 213. Also, the second insulating film pattern 400 may be disposed to be spaced apart by a predetermined distance from the drain contact plug 212. The second insulating film pattern 400 may have a third region formed on the substrate and a fourth region formed on the gate electrode, and the length of the third region may be formed to be shorter than the length of the fourth region. In addition, the second insulating film pattern 400 may be formed to directly contact the second conductivity type extended drain junction region 80, the drain region 210, and the drain silicide layer 213, in a non-limiting example.

Figure 3A:
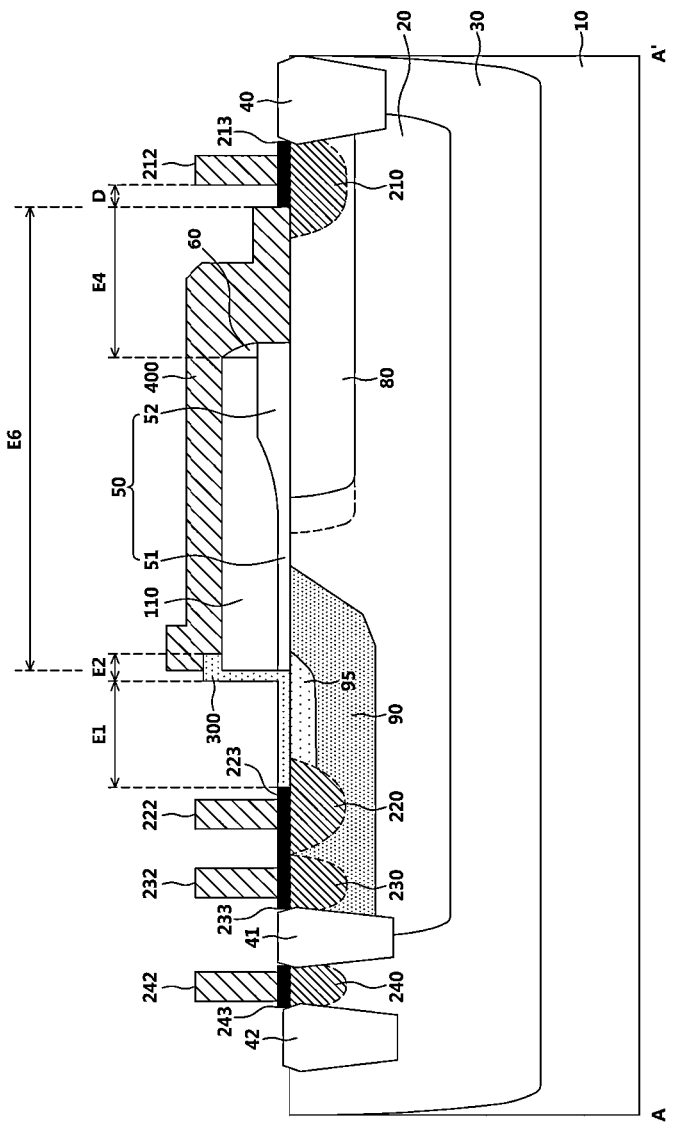
FIGS. 3A, 3B, and 3C are cross-sectional views of a semiconductor device with respect to lines B-B' and C-C' of FIG. 1B.
Figure 3B:
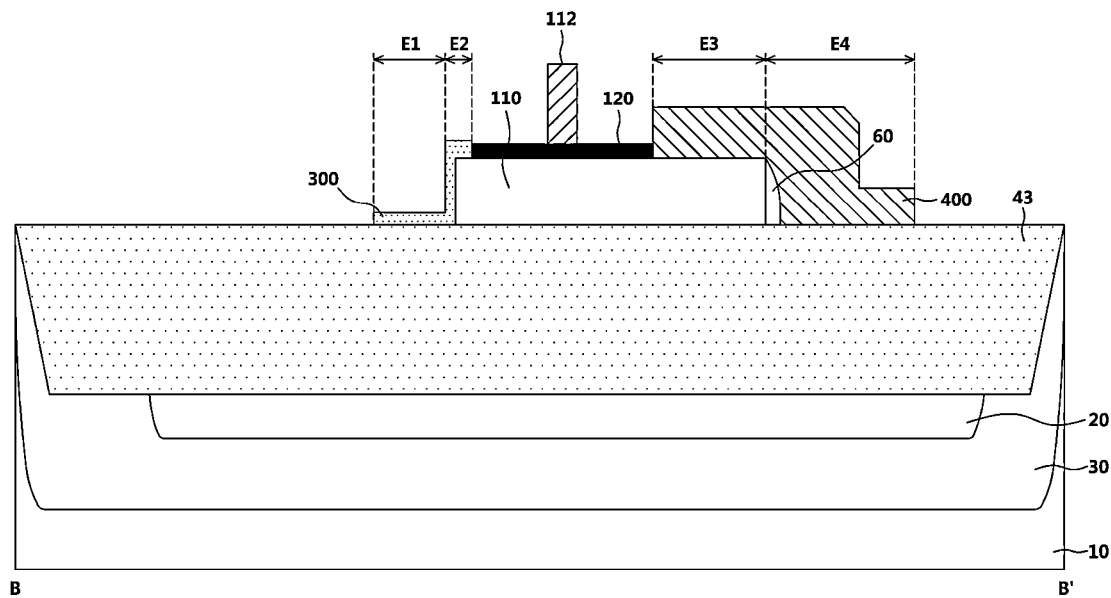

Additionally, the top surface of the gate electrode 110 may be formed to be in direct contact with the gate silicide layer 120, as shown in FIG. 3B, as well as the first insulating film pattern 300 and the second insulating film pattern 400. In addition, the first and second insulating film patterns may be formed to be spaced apart by a predetermined distance from the gate contact plug 112, as shown in FIG. 1A.

FIG. 2B illustrates a structure where no P-type body region 90 is formed, in the semiconductor device of FIG. 2A described in greater detail, above. The overall structure may be the same as that of the example of FIG. 2A, but the structure of FIG. 2B may be a structure omitting the P-type body region 90 that was present in FIG. 2A. As illustrated in FIG. 2B, even if the P-type body region 90 does not exist, a well region, such as a P-type well region, of the first conductivity type may perform the role of the channel region. Therefore, the P-type body region 90 may not be always be formed in the semiconductor device of this example, such as is shown in FIG. 2B.

Figure 2C:
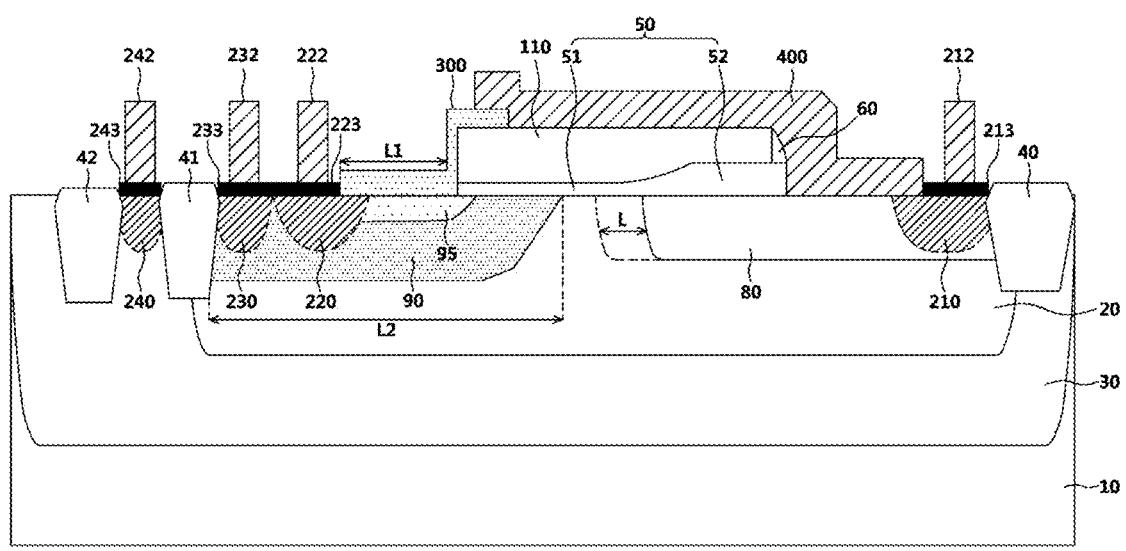

FIG. 2C illustrates a structure in which the first insulating film pattern 300 and the P-type body region 90 are extended to be longer than in the semiconductor device illustrated in FIG. 2A. When compared to FIG. 2A, the distance between the sidewall of the gate electrode 110 and the source region 220 may be formed to be longer, in the example of FIG. 2C.

Therefore, the first insulating film pattern 300 and the P-type body region 90 may be extended as much as L1 and L2, respectively, in the example of FIG. 2C.

FIG. 3A is a cross-sectional view illustrating each of the widths W of the first insulating film pattern 300 and the second insulating film pattern 400 of the semiconductor device, with respect to the line A-A' of FIG. 1A. FIG. 3A has the same cross-sectional structure as that of FIG. 2A described above, and thus the description of such a structure is omitted for brevity.

As illustrated in FIG. 3A, the first insulating film pattern 300 disposed between the gate electrode 110 and the source region 220 may be formed to have a step with a height equal to the height of the gate electrode 110 and to have widths E1 and E2, where the width E1 may be greater than the width E2. As illustrated in the drawing of FIG. 3A, E1 and E2 may be formed from the ends of the source silicide layer 223 to the top surface of the gate electrode 110. A part of the first insulating film pattern located on the top surface of the gate electrode 110 may partially overlap the second insulating film pattern 400.

In the second insulating film pattern 400, the width E4 may include from the sidewall of the gate electrode 110 where the spacer 60 is formed, to the boundary of the drain silicide layer 213. In addition, the second insulating film pattern 400 and the drain contact plug 212 may be formed to be spaced apart by a distance "D". The second insulating film pattern 400 and the drain contact plug 212 may be in contact with each other. However, in such a case, the length of the drain silicide layer 213 may be shortened, thereby increasing the contact resistance. Thus, it may be preferable to secure a distance "D" between the second insulating film pattern 400 and the drain contact plug 212, to better control the contact resistance.

Figure 3C:
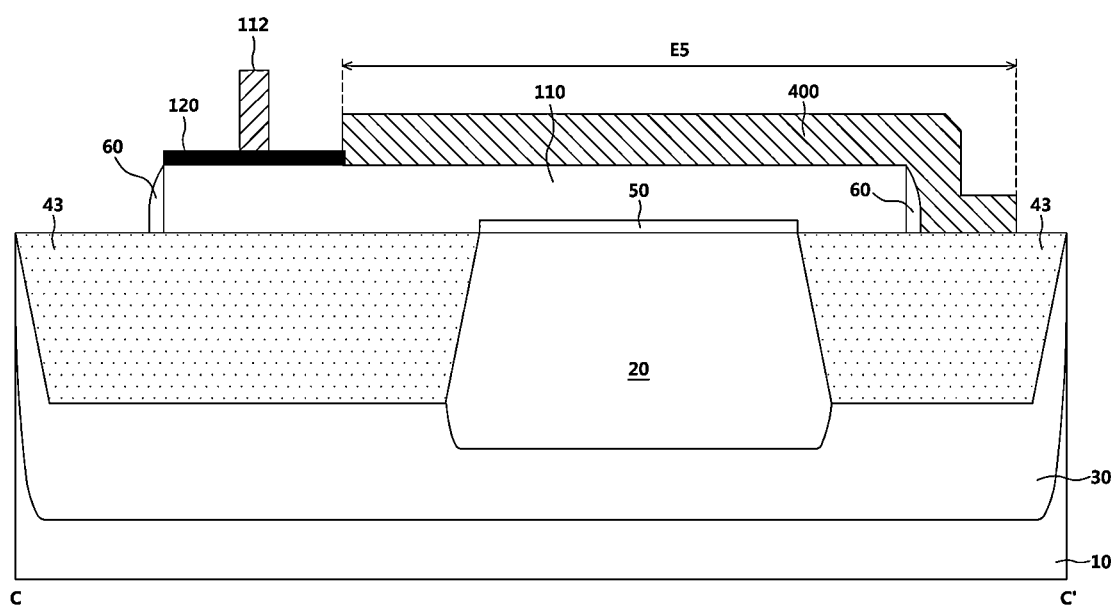

FIG. 3B is a cross-sectional view taken along line B-B' in FIG. 1B, and FIG. 3C is a cross-sectional view taken along line C-C' in FIG. 1B.

Referring to FIG. 3B, a second conductivity type deep well region 30 may be formed on the first conductivity type substrate 10. A well region 20 of the first conductivity type may be formed in the deep well region 30, wherein the source region and the drain region may be formed in the well region 20. A device isolation region 43 may be formed on the well region 20 of the first conductivity type. A gate electrode 110 may also be formed on the device isolation region 43.

A first insulating film pattern 300 and a spacer 60 may be formed on both sides of the gate electrode 110, respectively. A gate silicide layer 120, a first insulating film pattern 300, and a second insulating film pattern 400 may be formed on the gate electrode 110. A gate contact plug 112 may be disposed on the gate silicide layer 120.

As illustrated in FIG. 3B, first insulating film patterns E1 and E2 and second insulating film patterns E3 and E4 may be formed on both sides of the gate electrode 110, respectively. A gate silicide layer 120 may be formed on the top surface of the gate electrode 110 between the first insulating film pattern 300 and the second insulating film pattern 400. In addition, each end of the first insulating film pattern E1 and the second insulating film pattern E3 may be formed to be spaced apart from the gate contact plug 112 by a predetermined distance. The individual ends of the first insulating film pattern E1 and the second insulating film pattern E3 may both be formed to be in contact with the gate contact plug 112 along with each other, but in this example, the length of the gate silicide layer 120 may be shortened, such that there is a disadvantage that the gate contact resistance may be increased. Therefore, it may be preferable that individual ends of the first insulating film pattern E1 and the second insulating film pattern E3 may be formed to be spaced apart from the gate contact plug 112 by a predetermined distance.

Referring to the C-C' cross-sectional view of FIG. 3C, a first conductivity type well region 20 may be disposed between the portions of device isolation region 43, and a gate insulating film 50 may be formed on the well region 20. The gate insulating film 50 may be a gate insulating film including a first insulating film, having a thinner thickness, and a second insulating film, having a thicker thickness. A gate electrode 110 may be formed on the gate insulating film 50, and a spacer 60 may be formed on a side of the gate electrode 110. The gate electrode 110 may be formed on the first conductivity type well region 20, and may be disposed to overlap a part of the top surface of the device isolation region 43.

The second insulating film pattern 400 may be used for preventing the formation of silicide. The second insulating film pattern 400 may be formed of a material such as a silicon oxide (such as $SiO_2$) film, a silicon nitride film (SiN), or a silicon oxide nitride film (SiON) to have a predetermined thickness. As illustrated in FIG. 3C, the second insulating film pattern 400 may be spaced apart from the gate contact plug 112 by a predetermined distance, and may be formed on the gate electrode 110, the spacer 60, and the device isolation region 43, according to a non-limiting example. On one end of the gate electrode, the spacer 60 may be formed on all of the region where the first insulating film pattern 300 is not formed. Thus, the one end of the gate electrode may be isolated from the substrate 10 by the first insulating film pattern 300 and the spacer 60.

Figure 4:
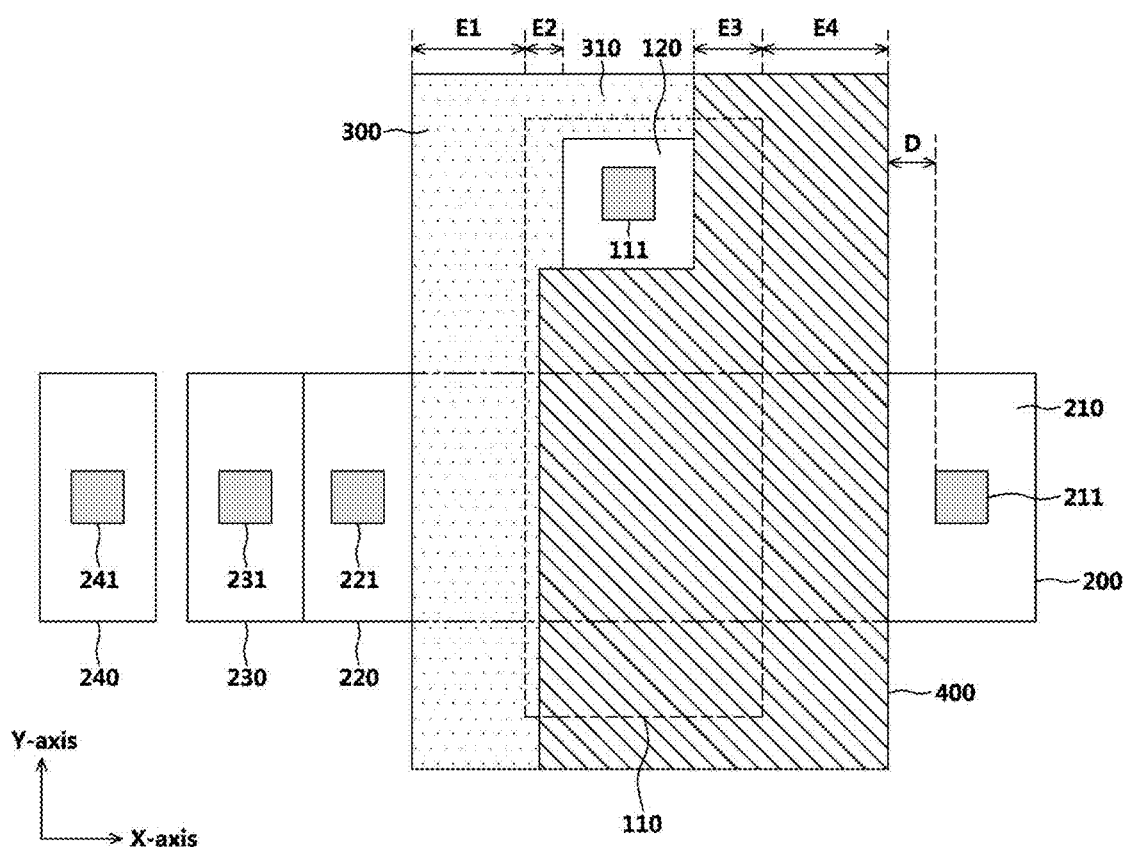
FIGS. 4 to 8 are plan views of a semiconductor device, according to one or more examples.

FIG. 4 is a plan view of a semiconductor device, according to one or more examples. FIG. 4 is mostly similar to the structure of FIG. 1A, and only different in the structure of the first insulating film pattern 300. For convenience of description, the same configuration as in FIG. 1A is denoted by the same reference numerals and the description of FIG. 4 focuses mainly on differences.

Referring to FIG. 4, the semiconductor device may further include an extension unit 310 formed on a part of the upper part of the first insulating film pattern 300. The extension unit 310 may have a shape in which one end of the first insulating film pattern 300 is in contact with the second insulating film, by being extended onto the first insulating film pattern 300. Therefore, the first insulating film pattern 300 and the second insulating film pattern 400 may completely surround the gate contact plug 111. Compared to FIG. 2A, in FIG. 4, the gate silicide layer 120 may be smaller with respect to the size of the extension unit 310. Therefore, the resistance of the gate electrode illustrated in FIG. 4 may have a greater resistance than that of the gate electrode of FIG. 2A. Therefore, it may be possible to further reduce the leakage current in such a manner.

Figure 5:
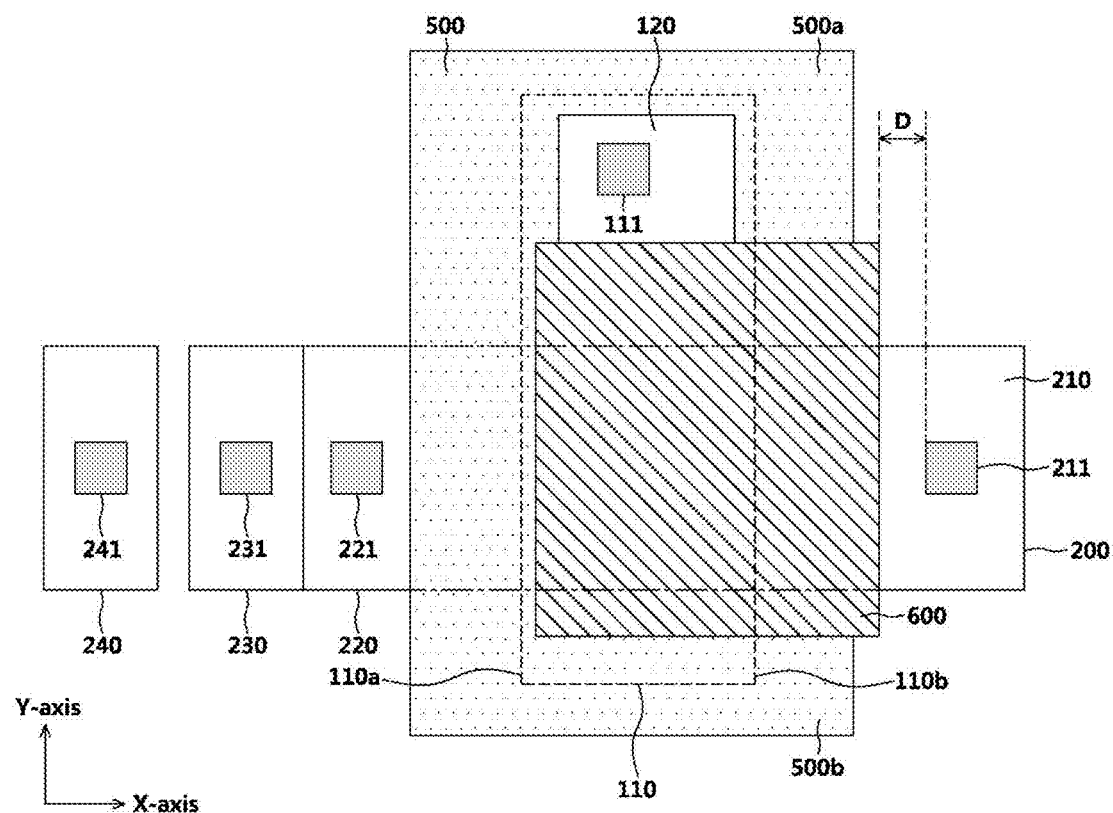

FIG. 5 is a plan view of a semiconductor device, according to one or more examples. In FIG. 5, the second insulating film pattern 400 illustrated in the above-described examples may be formed to be smaller in size, and conversely, the first insulating film pattern 300 may be formed to be larger in size. For convenience of description, the first insulating film pattern 300 and the second insulating film pattern 400 may be principally described.

Referring to FIG. 5, the first insulating film pattern 300 may be formed through a part of the gate electrode 110 and a part of the source region 220, and the first insulating film pattern 300 may further include a pair of vertically symmetrical extension units 500a and 500b. The first insulating film pattern 300 may surround the gate electrode 110 by the extension units 500a and 500b, except for the drain region 210. That is, the first insulating film pattern 300 may be formed to be in contact with all four surfaces of the gate electrode 110. In addition, the first insulating film pattern 300 may be disposed to be spaced apart by a predetermined distance from the gate contact plug 111.

The second insulating film pattern 400 may include a part of the gate electrode 110, and may be designed to be extended onto the drain region 210. As illustrated in FIG. 5, the second insulating film pattern 400 may be spaced apart from one end 110a of the gate electrode 110 that is in contact with the source region 220 and may overlap the other end 110b of the gate electrode 110. In addition, the second insulating film pattern 400 may be disposed spaced apart by a predetermined distance from the drain contact plug 211 and the gate contact plug 111. The second insulating film pattern 400 may be formed to have a substantially rectangular shape from a top view.

Figure 6:
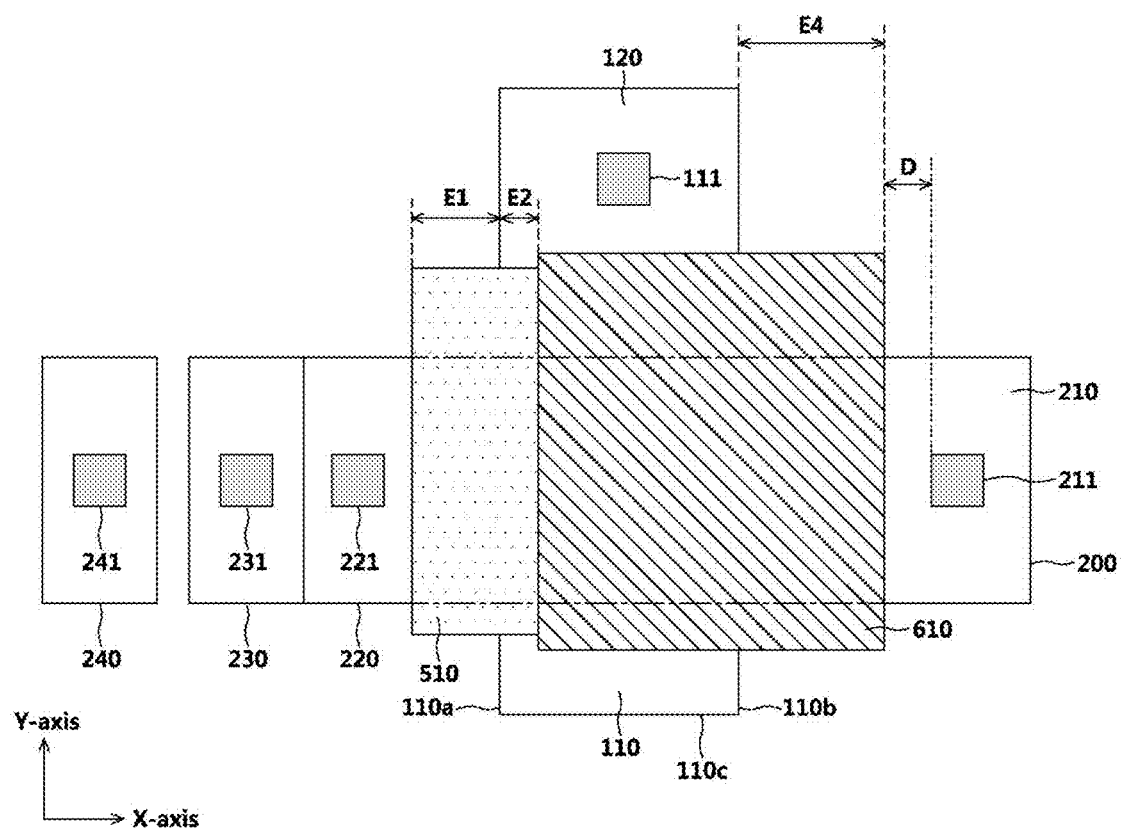

FIG. 6 is a plan view of a semiconductor device, according to one or more examples. Referring to FIG. 6, the sizes may be significantly reduced, as compared to the first insulating film pattern and the second insulating film pattern in other examples previously described.

In FIG. 6, the first insulating film pattern 510 may be formed over the source region 220 and the gate electrode 110. For example, in FIG. 6, E1 may be longer than E2. The first insulating film pattern 510 may be formed to be spaced apart from the source contact plug 221 by a predetermined distance. The second insulating film pattern 610 may be formed over the drain region 210, from the gate electrode 110. One end of the second insulating film pattern 610 may be formed to be in contact with the first insulating film pattern 510, and the other end of the second insulating film pattern 610 may be spaced apart from the drain contact plug 211 by a predetermined distance.

The size of the first insulating film pattern and the second insulating film pattern in FIG. 6 may shrink with respect to the other above-described examples, so that the gate silicide layer 120 may have a relatively larger area. In addition, at least three sides 110a, 110b, 110c of the gate electrode 110 may be free from the first insulating film pattern 300 and the second insulating pattern 400, according to such a non-limiting example.

As illustrated in FIG. 6, the first insulating film pattern 510 may extend toward the source region 220. Likewise, the second insulating film pattern 610 may extends toward the drain region 210. Thus, the first insulating film pattern 510 and the second insulating film pattern 610 may be partially enclosed by the gate contact plug 111, the drain contact plug 211, and the source contact plug 221, as shown in the example of FIG. 6.

Figure 7:
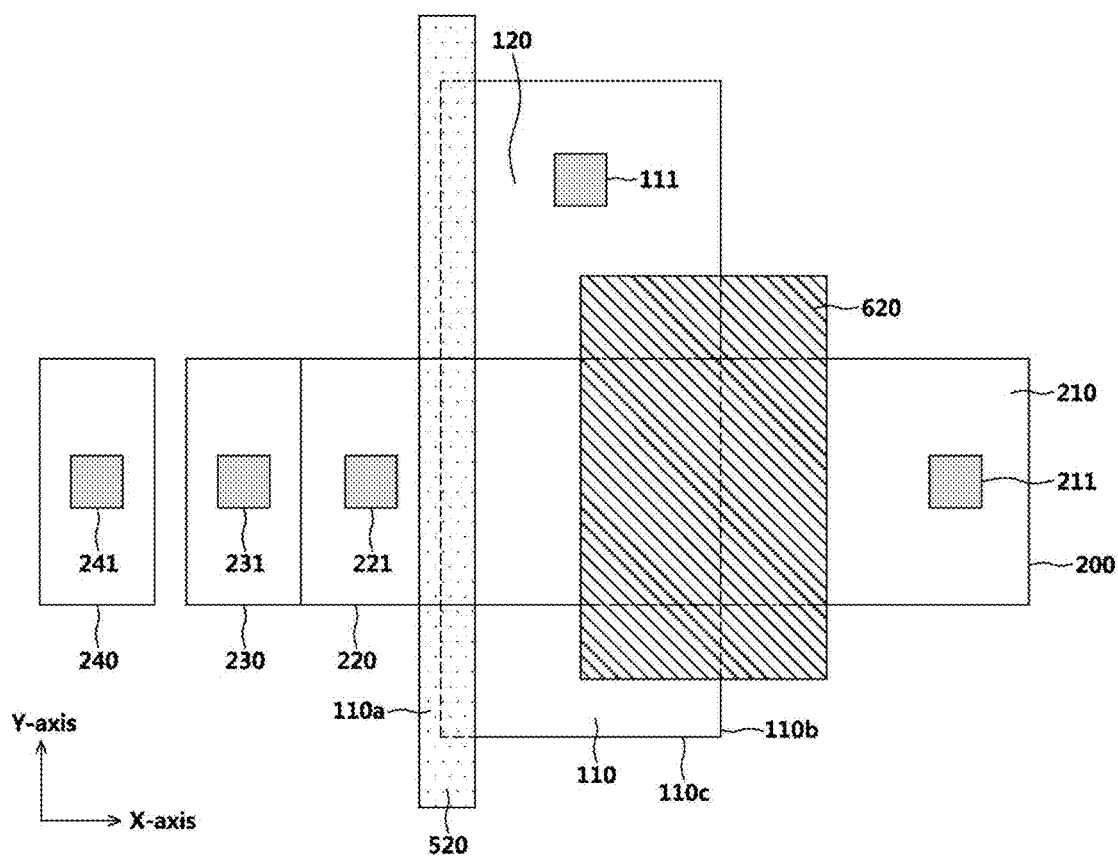

FIG. 7 is a plan view of a semiconductor device, according to one or more examples. FIG. 7 is a structure in which the first insulating film pattern 520 and the second insulating film pattern 620 may be spaced apart from each other. The first insulating film pattern 520 may be formed near the source region, and the second insulating film pattern 620 may be formed near the drain region. Referring to the drawing of FIG. 7, the first insulating film pattern 520 may be formed to have a long bar shape that is parallel to the interface between the source region 220 and the gate electrode 110. Also, the first insulating film pattern 520 may be disposed between the source contact plug 221 and the gate contact plug 111.

Because the first insulating film pattern 520 may be formed on a portion of the source region 220, the resistance between the gate contact plug 111 and the source contact plug 221 may be increased. Therefore, the leakage current generated between the gate electrode 110 and the source region 220 of the semiconductor device may be reduced, as a result.

In addition, a second insulating film pattern 620 may be formed between the gate electrode 110 and the drain region 210. Therefore, a sufficient resistance may be secured between the gate electrode 110 and the drain region 210, in order to reduce a leakage current.

In addition, a spacer may be formed on the other end 110b, 110c of the gate electrode. A spacer may always be formed in a region where no first insulating film pattern 520 is formed. The spacer may even be formed under the second insulating film pattern 620, because the first insulating film pattern 520 may not be formed under the second insulating film pattern 620.

Figure 8:
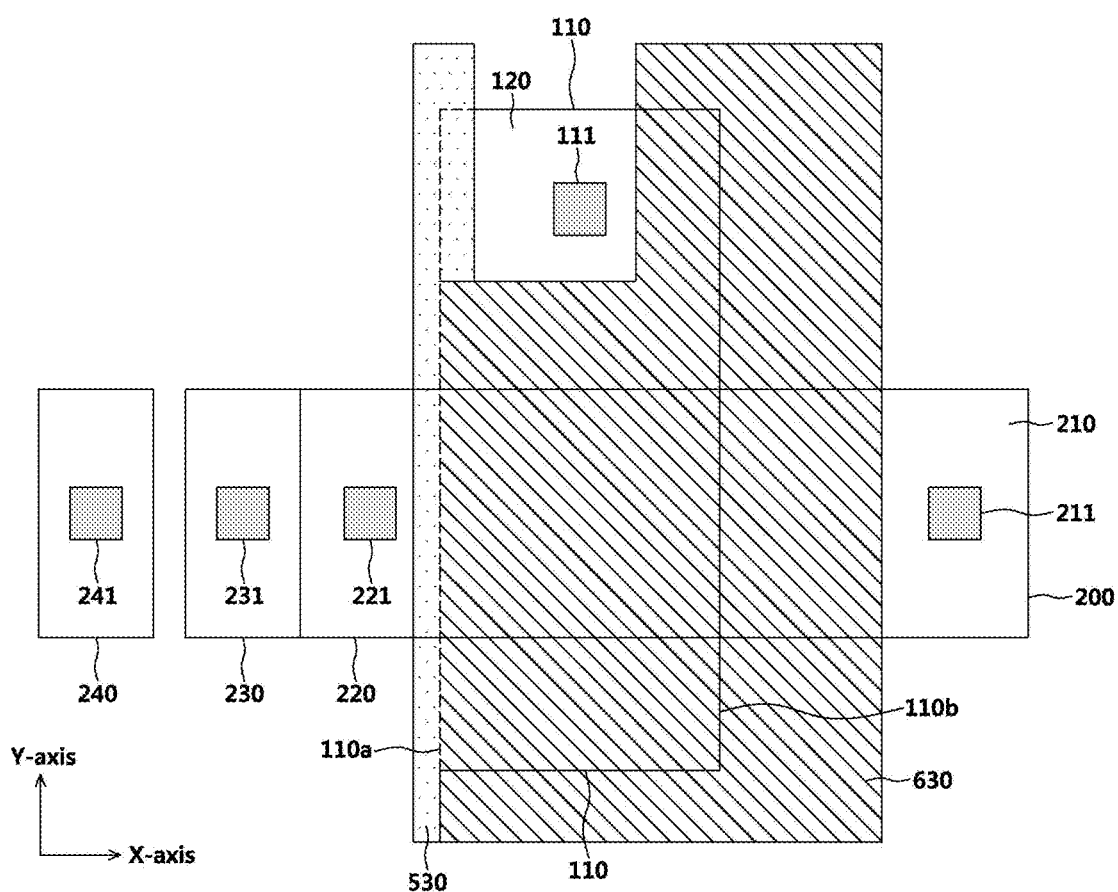

FIG. 8 is a structure in which the second insulating film pattern further extends in the direction of the first insulating film pattern, when compared to FIG. 7 illustrated above. FIG. 8 otherwise has a structure generally similar to that of FIG. 1A.

Referring to FIG. 8, the first insulating film pattern 530 may be a long bar shape disposed along the boundary surface between the source region 220 and the gate electrode 110. The second insulating film pattern 630 may partially overlap the first insulating film pattern 530, the gate electrode 110 and the drain region 210, according to a non-limiting example. In addition, the second insulating film pattern 630 may extend in the Y-axis direction so as to surround the gate contact plug 111.

As illustrated in FIG. 8, the gate contact plug 111 may be surrounded by the first insulating film pattern 530 and second insulating film pattern 630, according to a non-limiting example. Therefore, ESD or EOS immunity in the device may increase, accordingly.

Compared to FIG. 1A, only the size of the first insulating film pattern 530 may be small in FIG. 8. In addition, one end of the second insulating film pattern may be aligned with one end 110a of the gate electrode 110.

A semiconductor device according to one or more examples, described above, may be manufactured by using the following method, illustrated in FIGS. 9A to 9K. FIGS. 9A to 9K show a process flow chart illustrating a method of manufacturing a semiconductor device step by step, and are described in greater detail with reference to the individual drawings, presented below.

Figure 9A:
FIGS. 9A to 9K are process diagrams illustrating a manufacturing process of a semiconductor device, according to one or more examples.

Referring to FIG. 9A, a second conductivity type deep well region 30 may be formed on a first conductivity type substrate 10, and device isolation regions 40, 41, and 42 may be used to isolate from other devices by forming device isolation regions 40, 41, and 42 to a predetermined depth on the substrate 10. Next, the well region 20 of the first conductivity type may be formed in the second conductivity type deep well region 30. Alternatively, the device isolation regions 40, 41, and 42 may be formed first in the first conductivity type substrate 10, and then the second conductivity type deep well region 30 and the first conductivity type well region 20 may formed subsequently, in order.

Figure 9B:
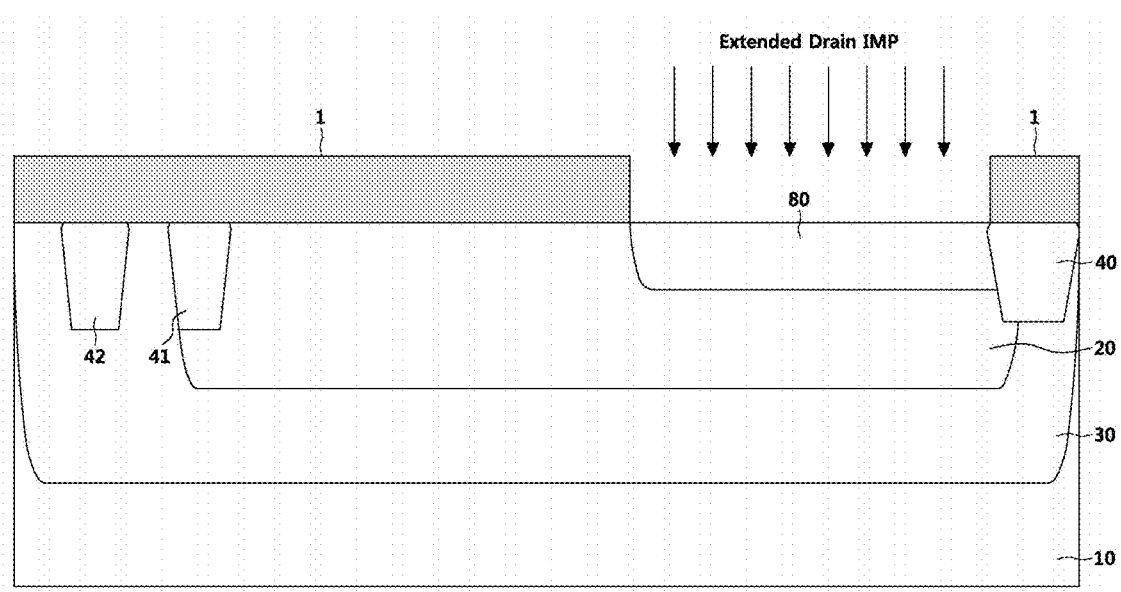

Referring to FIG. 9B, after forming a photoresist (PR) mask pattern 1 for forming an extended drain region 80, ion implantation may be performed to form the second conductivity type, such as N type, extended drain region 80, in the well region 20 of the first conductivity type, such as P type. The extended drain region 80 of the second conductivity type, such as N type, may be formed thinner than the device isolation region 40. This extended drain region 80 may be formed to be thinner than the depth of the device isolation region 40 in order to electrically isolate from the adjacent extended drain region of other device regions. The PR mask pattern 1 may be removed, in such a non-limiting example.

Figure 9C:
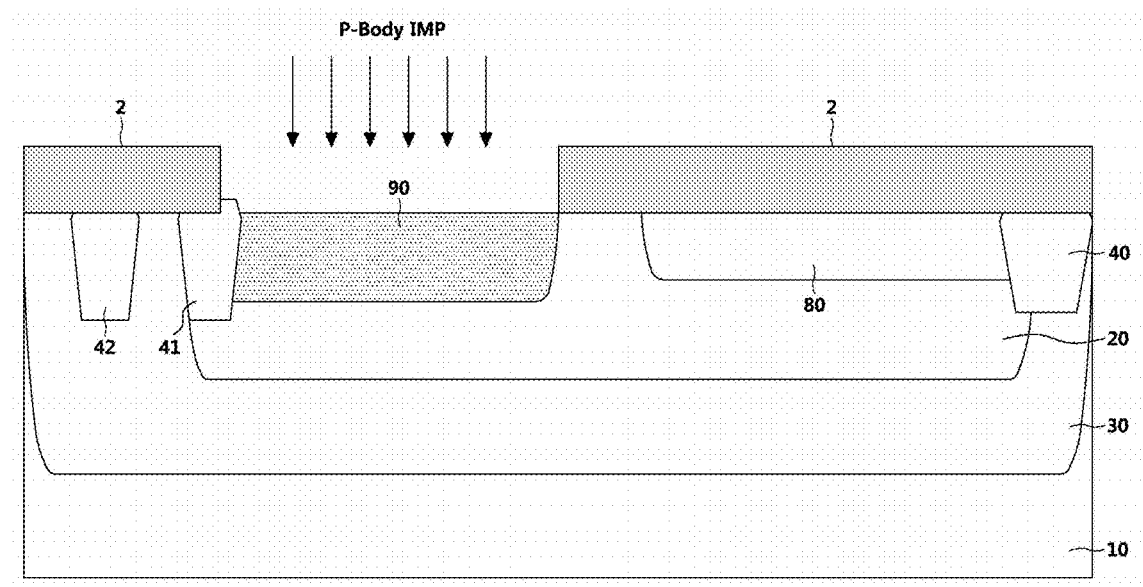
Figure 9D:
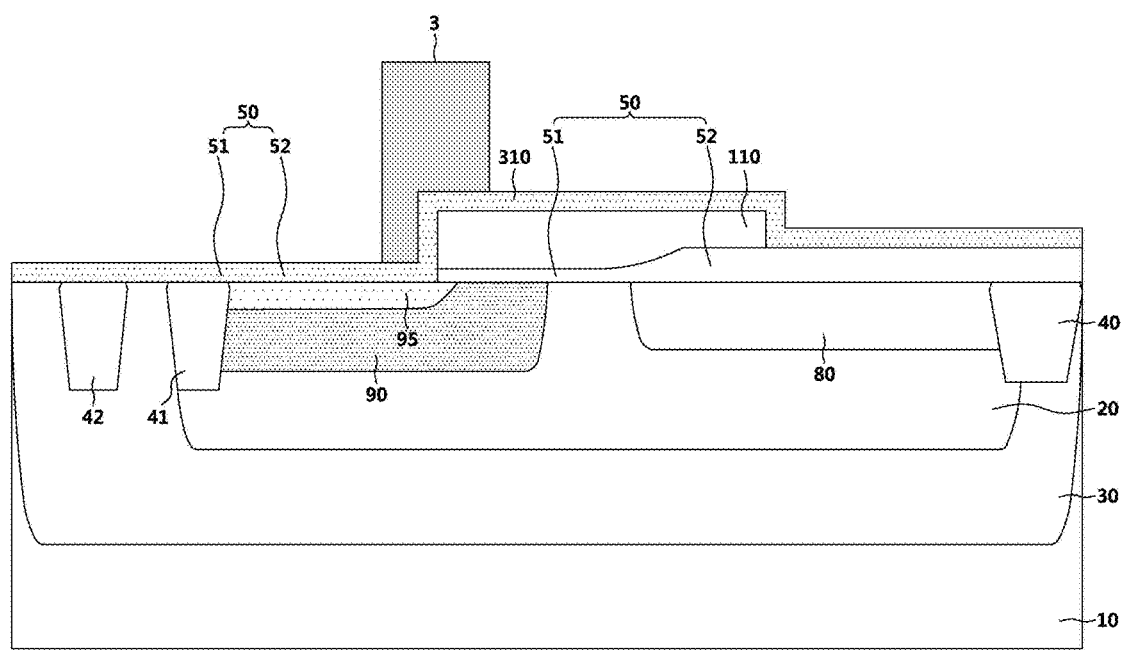

FIG. 9C illustrates a process of forming a P-type body region. The second PR mask pattern 2 for forming the P-type body region 90 may be formed, in a non-limiting example. Then, as illustrated in FIG. 9C, ion implantation may be performed to form the P-type body region 90. A depth of the P-type body region 90 may be thinner than a depth of the device isolation region 41, and the P-type body region 90 may be formed to be deeper than the extended drain region 80. The P-type body region 90 may be spaced apart from the extended drain region 80, or the P-type body region 90 and the extended drain region 80 may be in contact with each other.

According to the present one or more examples, the process of forming the P-type body region 90 of FIG. 9C may be occur before the formation of the extended drain region 80. Also, the process of forming the P-type body region 90 may be omitted, in other examples. This approach may possible because the well region 20 of the first conductivity type may perform the channel region instead, even though the P-type body region 90 may not be formed, as described above, according to other examples.

Referring to FIG. 9D, after removing the PR mask pattern 2 for forming the P-type body region, gate insulating films 51 and 52 having different thicknesses may be formed. The thickness between the gate insulating films 51 and 52 may become thicker gradually as the gate insulating films 51 and 52 extend toward the drain region (X-axis).

A gate electrode 110 may be formed on the gate insulating films 51 and 52. The gate electrode 110 may be formed by depositing a conductive material for a gate electrode on the gate insulating films 51 and 52, which may be formed by etching the conductive material after forming a mask pattern for the gate electrode on the conductive material.

After forming the gate electrode 110, lightly-doped-drain (LDD) ion implantation may be performed to form the LDD region 95 in the source region. LDD ion implantation may not be performed in the drain region because the extended drain region, such as a drift region, 80 may already be formed. The LDD region 95 may be formed to extend under the gate electrode, and the source region 220 may later be formed to overlap the LDD region. A channel region in the well region 20 may thus be formed between the N-type LDD region 95 and the N-type extended drain region.

After forming the LDD region 95, a first insulating film 310 of a predetermined thickness may be formed on the entire surface of the substrate 10. As illustrated in the drawing of FIG. 9D, the first insulating film 310 may cover the entire surface of the substrate 10, including the top and side surfaces of the gate electrode 110. The first insulating film 310 may be etched to form the first insulating film pattern 300 later. As for the material of the first insulating film 310, a material such as a silicon oxide film, a silicon nitride film, or a film combining two such films may be used, and deposited by Low Pressure Chemical Vapor Deposition (LPCVD) or Plasma-Enhanced Chemical Vapor Deposition (PECVD) method, as non-limiting examples, in that the materials and the deposition techniques are not limited to these particular enumerated examples.

The third mask pattern 3 may be formed on the first insulating film 310. The third mask pattern 3 may be used for forming the first insulating film pattern 300 in the semiconductor device. The third mask pattern 3 may be designed in consideration of the structure of the first insulating film pattern 300 as well as the structure of the second insulating film pattern that is to be formed later.

Figure 9E:
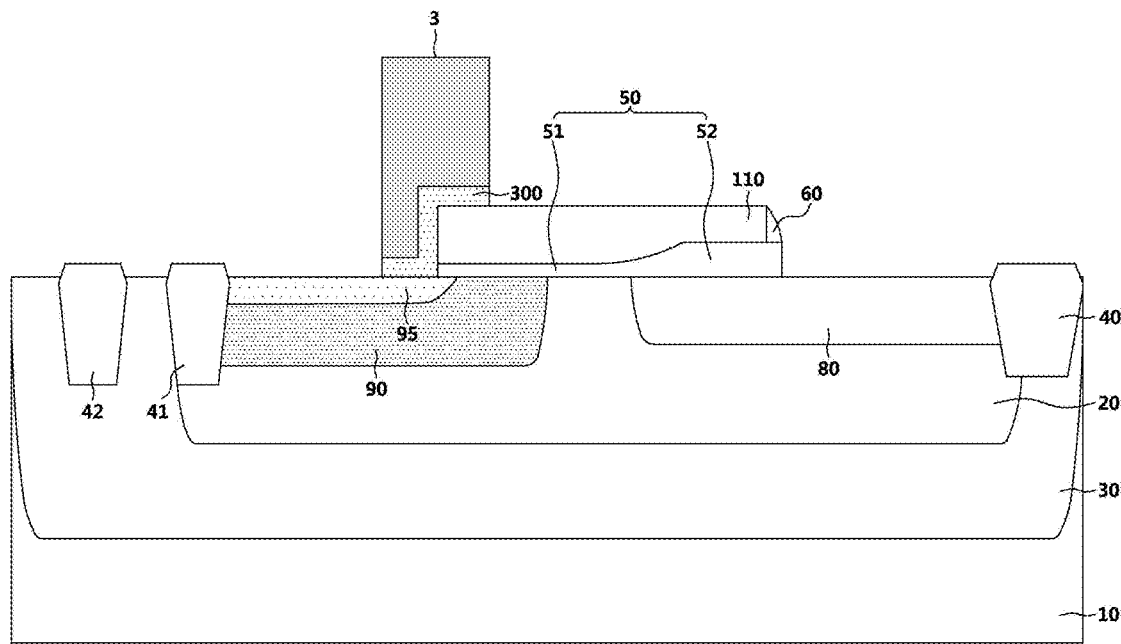

Referring to FIG. 9E, the first insulating film 310 may be etched using the third mask pattern 3 as a mask. The gate electrode 110, a part of the source region 90, and a part of the drain region 80 may be exposed by such etching. The first insulating film pattern 300 may remain in the region that is covered by the third mask pattern 3. The remaining region 300 may become such a first insulating film pattern 300. In addition, a spacer may be formed on the other end of the gate electrode 110 during the etching process. Thus, a first insulating film pattern 300 on one end of the gate electrode 110 and a spacer 60 may be formed on the other end of the gate electrode 110. A spacer insulating film 60 having a round shape may be formed by performing the etch-back process on the first insulating film 310. Thereafter, the third mask pattern 3 may be removed.

Figure 9F:
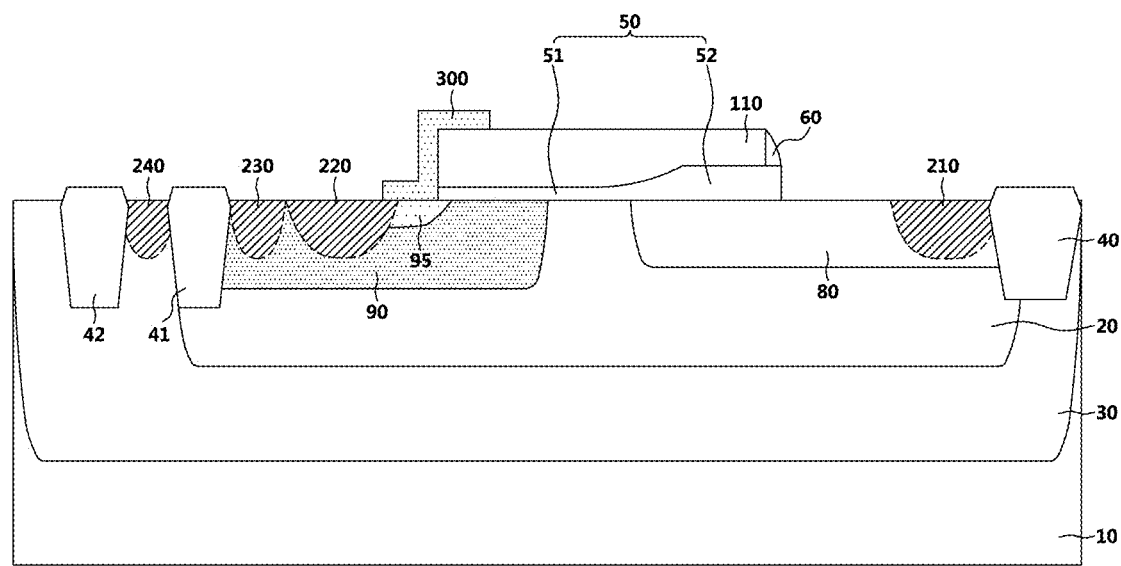

Referring to FIG. 9F, a first ion-implantation having first conductivity type dopants may be performed in order to form a body pickup region 230. A second ion-implantation having second conductivity type dopants may be performed to form a drain region 210, a source region 220 and a deep well pickup region 240 of the second conductivity type. For example, the drain region 210 may be formed in the extended drain region 80. On the other hand, the source region 220 and the body pickup region 230 may be formed in the P-type body region 90. The drain region 210 may be in contact with the device isolation region 40. The source region 220 may be formed to overlap a part of the first insulating film pattern 300. The deep well pickup region 240 may be spaced apart by a predetermined distance from the body pickup region 230, and may be disposed between the device isolation regions 41 and 42.

Figure 9G:
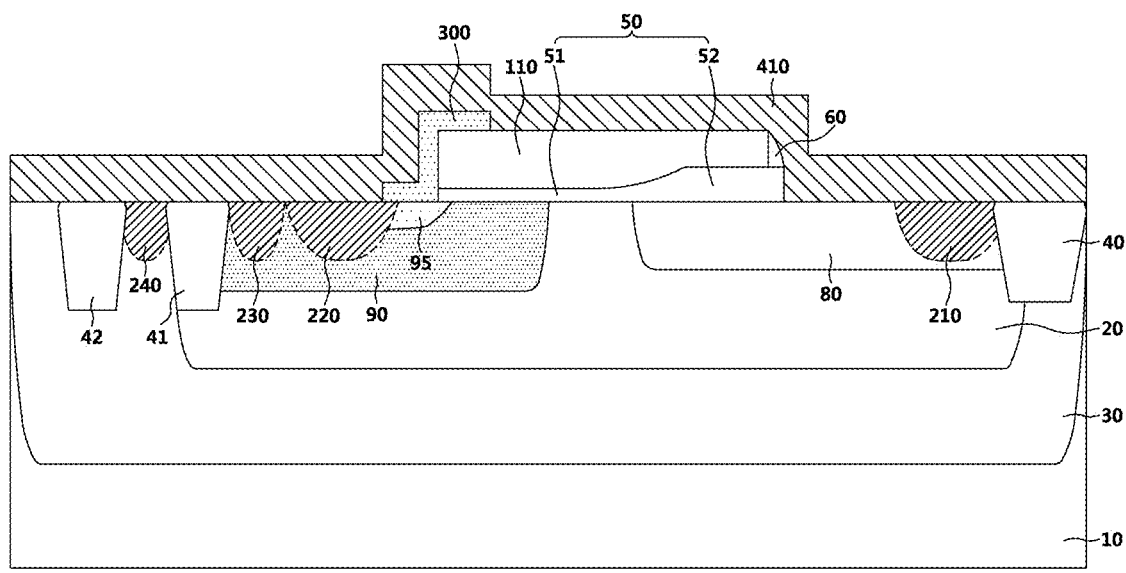
Figure 9H:
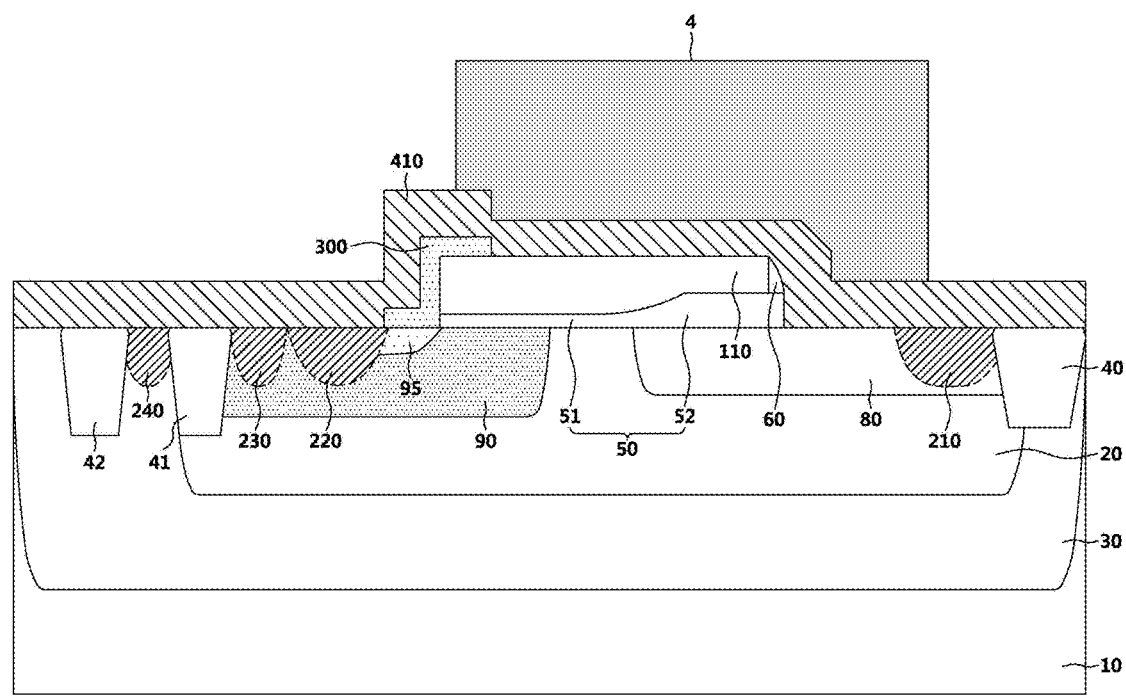

Next, the method may include a process of forming a second insulating film pattern. Referring to FIG. 9G, a second insulating film 410 may be deposited at a predetermined thickness on top of the entire surface of the substrate 10 for the forming of a second insulating film pattern. Reference numeral 410 may be the second insulating film before etching. Later, when a part is etched according to the etching process, the second insulating film pattern 400 according to the present one or more examples may be formed.

As illustrated in FIG. 9G, the second insulating film 410 may be deposited to entirely cover the gate electrode 110, the first insulating film pattern 300, the spacer 60, the extended drain region 980, the drain region 210, the source region 220, the body pickup region 230, the deep well pickup region 240 and the device isolation regions 40, 41 and 42, as a non-limiting example. The second insulating film 410 may be a material having the same constituent component materials as the first insulating film 310. Alternatively, the second insulating film 410 may be formed of different materials from those of the first insulating film 310, in order to have different etch selectivity with respect to the first insulating film pattern 300. The thickness of the second insulating film 410 may be formed to be thicker than a thickness of the first insulating film 310. In addition, the second insulating film 410 may be formed of a material such as a silicon oxide film (SiO or $SiO_2$), a silicon nitride film (SiN), or a silicon oxide nitride film (SiON) at a predetermined thickness, as non-limiting examples of materials.

As illustrated in FIG. 9H, a fourth mask pattern 4 may be formed on a part of the top surface of the second insulating film 410. The fourth mask pattern 4 may be formed only in a region where the second insulating film pattern 400 is to be formed. In the drawing, the fourth mask pattern 4 may be formed from the first insulating film pattern 300 to extend to a part of the drain region 210.

Figure 9I:
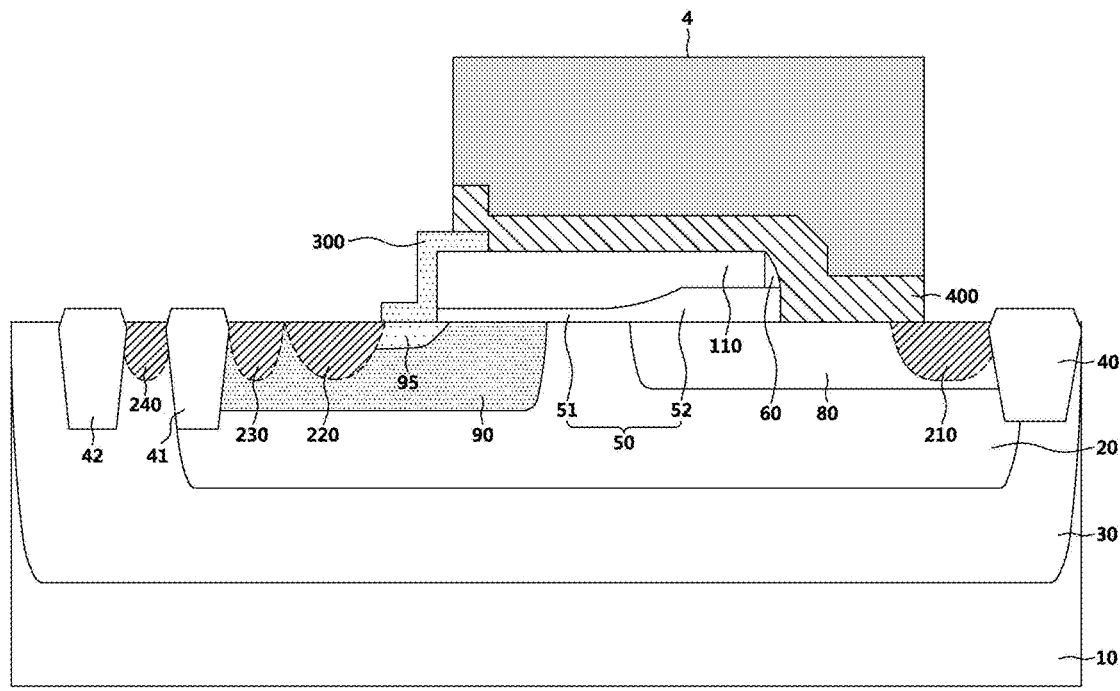

FIG. 9I illustrates an etching process is performed on the second insulating film 410 by using the fourth mask pattern 4 as a mask. Then, the second insulating film 410 may be selectively removed by the etching process, resulting in formation of the second insulating film pattern 400, as illustrated in FIG. 9I.

Figure 9J:
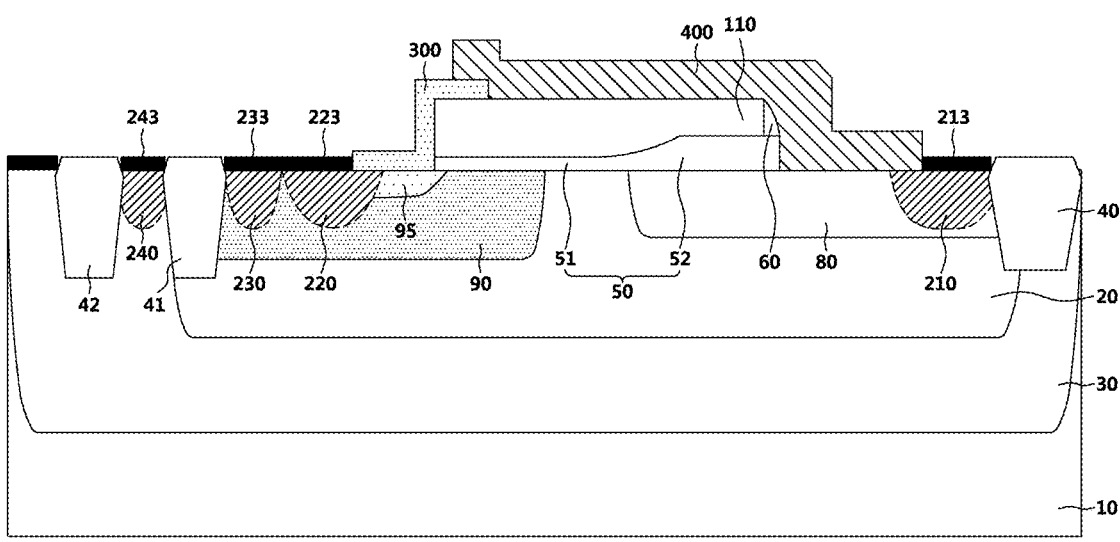

FIG. 9J illustrates a state in which the fourth mask pattern 4 is removed. As illustrated in FIG. 9J, the second insulating film pattern 400 may be formed from the top surface of the first insulating film pattern 300 to extend to a part of the drain region 210.

Then, the silicide layers 213, 223, 233, 243 may be respectively formed on the gate electrode 110, the drain region 210, the source region 220, the body pickup region 230, and the deep well pickup region 240. Silicide layers 213, 223, 233, 243 may be formed of silicides, such as cobalt silicide ($CoSi_2$), nickel silicide (NiSi), and titanium silicide ($TiSi_2$) materials, as non-limiting examples. The silicide layers may not be formed on the second insulating film pattern 400, the first insulating film pattern 300, and the spacer 60, because those insulating films 60, 300 and 400 may be used for blocking the formation of the silicide layers.

After forming the silicide layers 213, 223, 233, 243, a borderless contact insulating film and an interlayer insulating film may be formed on the second insulating film pattern 400, the first insulating film pattern 300 and the spacer 60. The borderless contact insulating film and the interlayer insulating film may be each be regarded as a separate film that is different from the second insulating film pattern 400 and the first insulating film pattern 300.

Figure 9K:
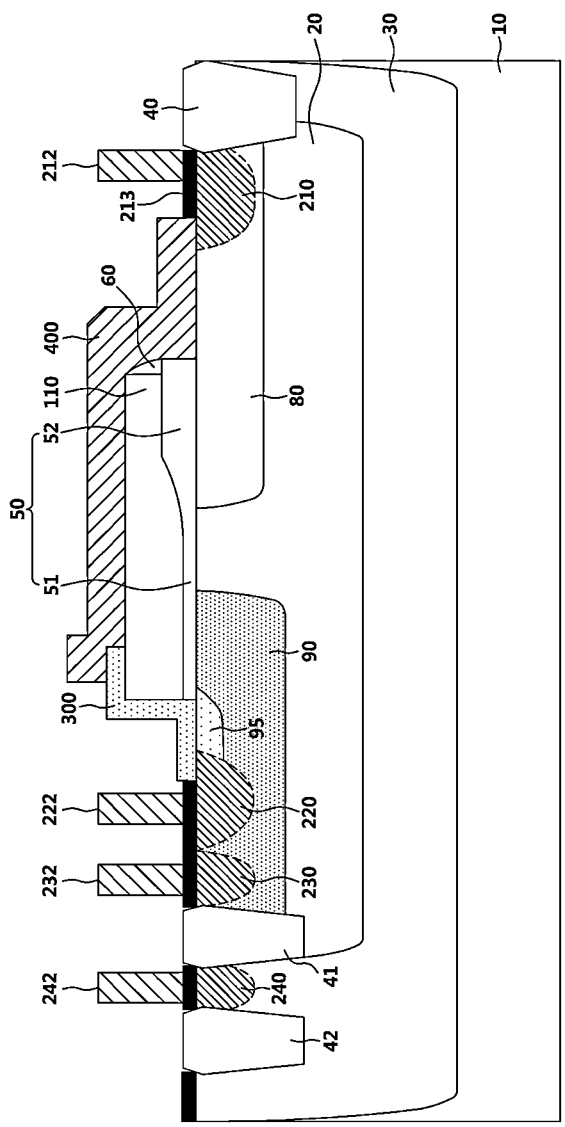

As illustrated in FIG. 9K, contact plugs 212, 222, 232, 242 may be formed to respectively connect the drain region 210, the source region 220, the body pickup region 230, and the deep well pickup region 240. In order to form the contact plugs 212, 222, 232, and 242, a borderless contact insulating film and an interlayer insulating film may be partially etched to form a hole, and a metallic material such as tungsten (W) is used to fill the hole, as a non-limiting example, and Chemical Mechanical Planarization (CMP) may be performed.

In summary, a manufacturing method of a semiconductor device, according to one or more examples may include, first, forming a deep well region and a device isolation region on a substrate, forming a well region of a first conductivity type in the deep well region, and forming a body region of a first conductivity type and an extended drain region of a second conductivity type on the well region of the first conductivity type.

Also, a manufacturing method may include forming again a gate insulating film and a gate electrode on the substrate, forming a first insulating film on the entire region of the substrate, forming a first mask pattern on the first insulating film, forming a first insulating film pattern on one end of the gate electrode using the first mask pattern, and forming a spacer on the other end of the gate electrode, removing the first mask pattern, forming a source region on one end of the gate electrode, forming a drain region on the other end of the gate electrode, and forming a deep well pickup region and a body pickup region in the deep well region and the body region, respectively.

Also, the manufacturing method may include depositing a second insulating film on the entire surface of the substrate, forming a second mask pattern on the second insulating film, removing the second insulating film formed on one end of the gate electrode using the second mask pattern, and forming a second insulating film pattern on the other end of the gate electrode and the spacer, removing the second mask pattern, forming a drain silicide layer on the drain region, forming a source silicide layer on the source region, and forming a drain contact plug and a source contact plug on the drain silicide layer and the source silicide layer, respectively. In addition, the first insulating film pattern and the second insulating film pattern may be in contact with each other.

In the manufacturing process of FIGS. 9A-9K, the structures of the first insulating film pattern 300 and the second insulating film pattern 400 may represent manufacturing processes based on the structure illustrated in FIG. 1A. The first insulating film pattern 300 and the second insulating film pattern 400 may formed by using respective mask patterns. Therefore, in case of forming the first insulating film pattern and the second insulating film pattern illustrated in FIGS. 4 to 8, as described previously, the layout of the mask pattern may be changed. The first insulating film pattern and the second insulating film pattern, having various shapes, may be formed only by changing the layout of the mask pattern.

According to the semiconductor device and the method of manufacturing the semiconductor device of the one or more examples, as described above, it may be possible to prevent a leakage current between the gate electrode and the source region, by forming a first insulating film pattern on one end of the gate electrode in the direction of the source region, instead of forming a spacer.

According to the semiconductor device and the method of manufacturing the semiconductor device of the one or more examples, a spacer and a second insulating film pattern may be formed on the other end of the gate electrode, toward the drain region, to prevent leakage current from occurring between the gate electrode and drain region.

According to the semiconductor device and the method of manufacturing the semiconductor device of the one or more examples, there may be an effect of reducing the leakage current between the gate electrode-source region or the gate electrode-drain region by forming the first and second insulating film patterns to extend to the top surface of the gate electrode. Therefore, more stable semiconductor device function may be provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
    an active region formed on a substrate of a first conductivity type;
    a source region, a drain region, and a gate insulating film respectively formed on the active region;
    a gate electrode formed on the gate insulating film;
    a first insulating film pattern extending from the source region to the gate electrode, contacting an upper surface of the source region and a side and upper surface of the gate electrode, and configured to prevent a silicide layer from forming on both the source region and the gate electrode where the first insulating film pattern is formed;
    an extended drain junction region of a second conductivity type under the gate electrode; and
    a second insulating film pattern contacting an upper surface of the extended drain junction region and the upper surface of the gate electrode,
    wherein each end of the first and second insulating film patterns overlap each other on the upper surface of the gate electrode.

2. The semiconductor device of claim 1, wherein the gate insulating film comprises a first gate insulating film having a first thickness and a second gate insulating film having a second thickness greater than the first thickness.

3. The semiconductor device of claim 2, wherein the extended drain junction region extends from the drain region to a region overlapping the first gate insulating film.

4. The semiconductor device of claim 1, further comprising:
    a well region of the first conductivity type formed on the substrate;
    a body region of the first conductivity type surrounding the source region;
    a lightly-doped-drain (LDD) region formed on a side surface of the source region;
    a body pickup region of the first conductivity type formed in the body region of the first conductivity type;
    a deep well region of the second conductivity type comprising the well region of the first conductivity type; and
    a deep well pickup region of the second conductivity type formed in the deep well region of the second conductivity type.

5. The semiconductor device of claim 4, wherein the first insulating film pattern is in contact with the source region, the LDD region, and the upper surface of the gate electrode.

6. The semiconductor device of claim 1, wherein the first insulating film pattern is thinner than the second insulating film pattern.

7. A semiconductor device, comprising:
    an active region formed on a substrate of a first conductivity type;
    a source region, a drain region, and a gate insulating film respectively formed on the active region;
    a gate electrode formed on the gate insulating film;
    a first insulating film pattern extending from the source region to the gate electrode, in direct contact with a top surface of the source region and a side and top surface of the gate electrode, and configured to prevent a silicide layer from forming on both the source region and the gate electrode where the first insulating film pattern is formed;

an extended drain junction region of a second conductivity type under the gate electrode; and a second insulating film pattern formed to contact the upper surface of the gate electrode and an upper surface of the extended drain junction region of the second conductivity type, wherein the second insulating film pattern is thicker than the first insulating film pattern.

8. The semiconductor device of claim 7, wherein each one end of each of the first and second insulating film patterns overlaps each other on the upper surface of the gate electrode.

9. The semiconductor device of claim 7, wherein the gate insulating film comprises a first gate insulating film having a first thickness and a second gate insulating film having a second thickness greater than the first thickness.

10. The semiconductor device of claim 7, wherein the extended drain junction region extends from the drain region to a region overlapping the first gate insulating film.

11. The semiconductor device of claim 7, further comprising:

a well region of the first conductivity type formed on the substrate;

a body region of the first conductivity type surrounding the source region;

a lightly-doped-drain (LDD) region formed on a side surface of the source region;

a body pickup region of the first conductivity type formed in the body region of the first conductivity type;

a deep well region of the second conductivity type comprising the well region of the first conductivity type; and a deep well pickup region of the second conductivity type formed in the deep well region of the second conductivity type.

12. The semiconductor device of claim 11, wherein the first insulating film pattern is in contact with the source region, the LDD region, and the upper surface of the gate electrode.

* * * * *